United States Patent
Shin et al.

(10) Patent No.: US 11,048,586 B2
(45) Date of Patent: Jun. 29, 2021

(54) MEMORY SYSTEMS AND METHODS OF CORRECTING ERRORS IN THE MEMORY SYSTEMS

(71) Applicant: SK hynix Inc., Icheon-si (KR)

(72) Inventors: Won Gyu Shin, Seoul (KR); Jung Hyun Kwon, Seoul (KR); Jin Woong Suh, Icheon-si (KR); Do Sun Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/883,783

(22) Filed: May 26, 2020

(65) Prior Publication Data
US 2021/0019227 A1 Jan. 21, 2021

(30) Foreign Application Priority Data
Jul. 17, 2019 (KR) .................. 10-2019-0086680

(51) Int. Cl.
 *G06F 11/00* (2006.01)
 *G06F 11/10* (2006.01)
 *H03M 13/15* (2006.01)

(52) U.S. Cl.
 CPC ..... *G06F 11/1076* (2013.01); *H03M 13/1515* (2013.01)

(58) Field of Classification Search
None
See application file for complete search history.

(56) References Cited

U.S. PATENT DOCUMENTS

| | | | | | |
|---|---|---|---|---|---|
| 6,968,021 | B1* | 11/2005 | White | ............. | H04L 1/005 375/265 |
| 7,865,809 | B1* | 1/2011 | Lee | ............. | H03M 13/1535 714/782 |
| 2009/0268521 | A1* | 10/2009 | Ueno | ............. | G11C 29/50 365/185.11 |
| 2010/0299575 | A1* | 11/2010 | Roth | ............. | H03M 13/17 714/755 |
| 2012/0060056 | A1* | 3/2012 | Lee | ............. | G06F 11/1048 714/15 |
| 2013/0100737 | A1* | 4/2013 | Kwak | ............. | G11C 16/10 365/185.11 |

(Continued)

FOREIGN PATENT DOCUMENTS

KR 101149110 B1 5/2012

OTHER PUBLICATIONS

K. Gorman, M. Roberge, A. Paparelli, G. Pomichter, S. Sliva and W. Corbin, "Advancements in at-speed array BIST: multiple improvements," 2007 IEEE International Test Conference, Santa Clara, CA, USA, 2007, pp. 1-10, doi: 10.1109/TEST.2007.4437566. (Year: 2007).*

*Primary Examiner* — Daniel F. McMahon
(74) *Attorney, Agent, or Firm* — William Park & Associates Ltd.

(57) ABSTRACT

A memory system includes a memory medium, a loop-buffer configured to store read data outputted from the memory medium in a first operation mode, a fake-command generator configured to generate a fake-command in a second operation mode, and an error correction code (ECC) decoder configured to perform an ECC decoding operation of the read data stored in the loop-buffer in response to the fake-command.

18 Claims, 29 Drawing Sheets

(56) References Cited

U.S. PATENT DOCUMENTS

2014/0245105 A1* 8/2014 Chung ............... G06F 11/1076
            714/763
2017/0004035 A1* 1/2017 Suh .................... G06F 11/1068
2019/0155685 A1* 5/2019 Kim ....................... G11C 29/52
2019/0221279 A1* 7/2019 Lee ....................... G11C 16/10
2019/0385693 A1* 12/2019 Shin ...................... G11C 29/42

* cited by examiner

MEMORY SYSTEMS AND METHODS OF CORRECTING ERRORS IN THE MEMORY SYSTEMS

CROSS-REFERENCE TO RELATED APPLICATIONS

The present application claims priority under 35 U.S.C. 119(a) to Korean Application No. 10-2019-0086680, filed on Jul. 17, 2019, which is herein incorporated by references in its entirety.

BACKGROUND

1. Technical Field

Various embodiments of the disclosed technology relate to memory systems and, more particularly, to memory systems and methods of correcting errors in the memory systems.

2. Related Art

In general, a path for transmitting information on is called a channel. When the information is transmitted using cable communication, a transmission line through which the information is transmitted may act as the channel. When the information is transmitted using wireless communication, the channel may be air in which electromagnetic waves including the information are propagated. Processes for storing data into memory media (e.g., memory devices) and for reading out the data from the memory media may be performed through the channel.

When the data are transmitted through the channel, an error may be included in the data. Thus, a lot of effort has been continuously focused on developing devices and methods for detecting errors from erroneous data and for removing the detected errors to restore the erroneous data to their original data. An error correction code (ECC) encoding operation and an ECC decoding operation have been widely used in memory systems including the memory media. The ECC encoding operation may correspond to a process for generating transmission data by adding an error control code (or the error correction code) to original data (i.e., write data) before the original data are transmitted to perform a write operation. The ECC decoding operation may correspond to a process for performing a read operation to read out data stored in the memory media and for separating the read data into the original data and the added code to restore the read data to the original data.

SUMMARY

According to an embodiment, a memory system may include a memory medium, a loop-buffer configured to store read data outputted from the memory medium in a first operation mode, a fake-command generator configured to generate a fake-command in a second operation mode, and an error correction code (ECC) decoder configured to perform an ECC decoding operation of the read data stored in the loop-buffer in response to the fake-command.

According to another embodiment, a memory system may include a memory medium, a command control unit, a loop-buffer, a loop-counter and an error correction code (ECC) decoder. The command control unit may be configured to generate a preliminary fake-command control signal and a fake-command in a first operation mode and a second operation mode, respectively. The loop-buffer may be configured to store read data outputted from the memory medium in response to the preliminary fake-command control signal in the first operation mode and configured to output read data stored in the loop-buffer in response to the fake-command in the second operation mode. The loop-counter may be configured to perform a reset operation in response to the preliminary fake-command control signal in the first operation mode and configured to output a count value of the loop-counter in response to the fake-command in the second operation mode. The ECC decoder may be configured to perform a first ECC decoding operation of the read data outputted from the memory medium in the first operation mode and configured to perform a second ECC decoding operation of the read data outputted from the loop-buffer in the second operation mode.

According to yet another embodiment, there may be provided an error correction method of a memory system. The error correction method may include performing a first error correction code (ECC) decoding operation of read data outputted from a memory medium and storing the read data outputted from the memory medium into a loop-buffer, in a first operation mode. A second ECC decoding operation of the read data stored in the loop-buffer may be performed in a second operation mode.

BRIEF DESCRIPTION OF THE DRAWINGS

Certain features of the disclosed technology are illustrated by various embodiments with reference to the attached drawings, in which.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
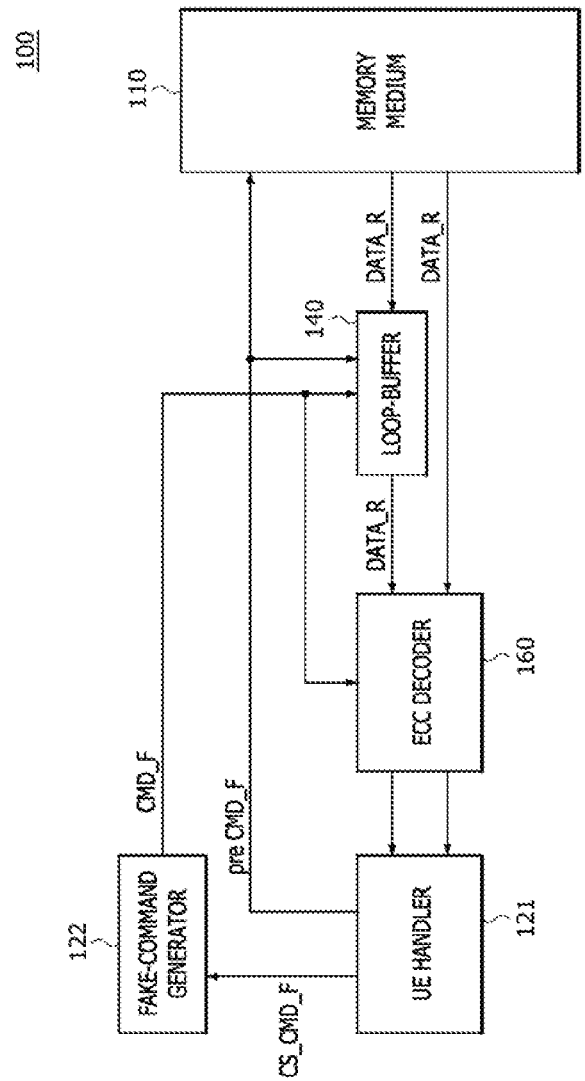
FIG. 1 is a block diagram illustrating an example of a memory system according to an embodiment of the present disclosure.

FIG. 1 is a block diagram illustrating a memory system 100 according to an embodiment of the present disclosure.

Referring to FIG. 1, the memory system 100 may be configured to include a memory medium 110, an uncorrectable-error (UE) handler 121, a fake-command generator 122, a loop-buffer 140, and an ECC decoder 160. The memory medium 110 may be a memory chip or a memory module. When the memory medium 110 is a memory chip, the memory medium 110 may include a plurality of memory regions. In such a case, read access operations for all of the memory regions may be simultaneously performed during the read access to the memory medium 110. When the memory medium 110 is a memory module, the memory medium 110 may include a plurality of memory chips. In such a case, the read access operations for all of the memory chips may be simultaneously performed during the read access to the memory medium 110. In an embodiment, the memory medium 110 may include a nonvolatile memory device such as a flash memory device, a phase change memory (PCRAM) device, a resistive memory (ReRAM) device, a ferroelectric memory (FeRAM) device or a magnetic memory (MRAM) device. Alternatively, the memory medium 100 may also include a volatile memory device such as a dynamic random access memory (DRAM) device.

The UE handler 121 may receive ECC decoded data from the ECC decoder 160 and may determine an operation mode (corresponding to any one of a first operation mode and a second operation mode) to generate control signals for an operation in the determined operation mode. In an embodiment, the first operation mode may be determined when errors of read data outputted from the memory medium 110 are not corrected by a normal read operation and/or a retry operation, and the second operation mode may be determined when errors of the read data outputted from the memory medium 110 are not corrected in the first operation mode. The UE handler 121 may generate a preliminary fake-command control signal pre_CMD_F in the first operation mode. If the preliminary fake-command control signal pre_CMD_F is generated, read data DATA_R outputted from the memory medium 110 may be inputted to the loop-buffer 140 and the ECC decoder 160. The UE handler 121 may generate a fake-command control signal CS_CMD_F in the second operation mode. The fake-command control signal CS_CMD_F may be inputted to the fake-command generator 122.

The fake-command generator 122 may generate a fake-command CMD_F in response to the fake-command control signal CS_CMD_F outputted from the UE handler 121. The fake-command CMD_F may be inputted to the loop-buffer 140 and the ECC decoder 160. In an embodiment, while the fake-command control signal CS_CMD_F is not inputted to the fake-command generator 122, no command is not generated by the fake-command generator 122. If the fake-command CMD_F is generated by the fake-command generator 122, the access to the memory medium 110 may terminate in the memory system 100. That is, when the fake-command CMD_F is generated, a read operation and a write operation of the memory medium 110 might not be performed.

The loop-buffer 140 may perform an operation for storing data into the loop-buffer 140 in the first operation mode and may perform an operation for outputting the data stored in the loop-buffer 140 in the second operation mode. Specifically, the loop-buffer 140 may receive the preliminary fake-command control signal pre_CMD_F from the UE handler 121 in the first operation mode and may store the read data DATA_R outputted from the memory medium 110 in response to the preliminary fake-command control signal pre_CMD_F. Moreover, the loop-buffer 140 may receive the fake-command CMD_F from the fake-command generator 122 in the second operation mode and may output the read data DATA_R stored in the loop-buffer 140 to the ECC decoder 160 in response to the fake-command CMD_F.

The ECC decoder 160 may perform an ECC decoding operation of the read data DATA_R to detect an error of the read data DATA_R and may correct the error of the read data DATA_R when the read data DATA_R are erroneous data. In an embodiment, the ECC decoding operation performed by the ECC decoder 160 may be executed using a Reed-Solomon (RS) coding method correcting errors in units of symbols. The ECC decoding operation performed by the ECC decoder 160 may be executed using different methods in the first and second operation modes. In the first operation mode, the ECC decoder 160 may receive the read data DATA_R from the memory medium 110 without receiving the read data DATA_R from the loop-buffer 140. For example, in the first operation mode, the ECC decoder 160 may directly receive the read data DATA_R from the memory medium 110 without receiving the read data DATA_R through the loop-buffer 140 from the memory medium 110. In such a case, the ECC decoding operation performed by the ECC decoder 160 may be executed using a general Reed-Solomon (RS) algorithm system. In the present embodiment, "the ECC decoding operation using a general RS algorithm system" may be defined as an ECC decoding operation executed for detecting error locations and correcting the errors using only parity symbols included in the read data DATA_R without erasing symbols. In such a case, the number of correctable symbols (i.e., error correction capability) may be determined by the number of the parity symbols. In the second operation mode, the ECC decoder 160 may receive the read data DATA_R from the loop-buffer 140. In such a case, the ECC decoder 160 may perform the ECC decoding operation of the read data DATA_R using an Reed-Solomon (RS) erasure-loop method. In the present embodiment, "the ECC decoding operation using an RS erasure-loop method" may be defined as an ECC decoding operation executed for detecting error locations and correcting the errors while symbols are sequentially erased.

Figure 2:
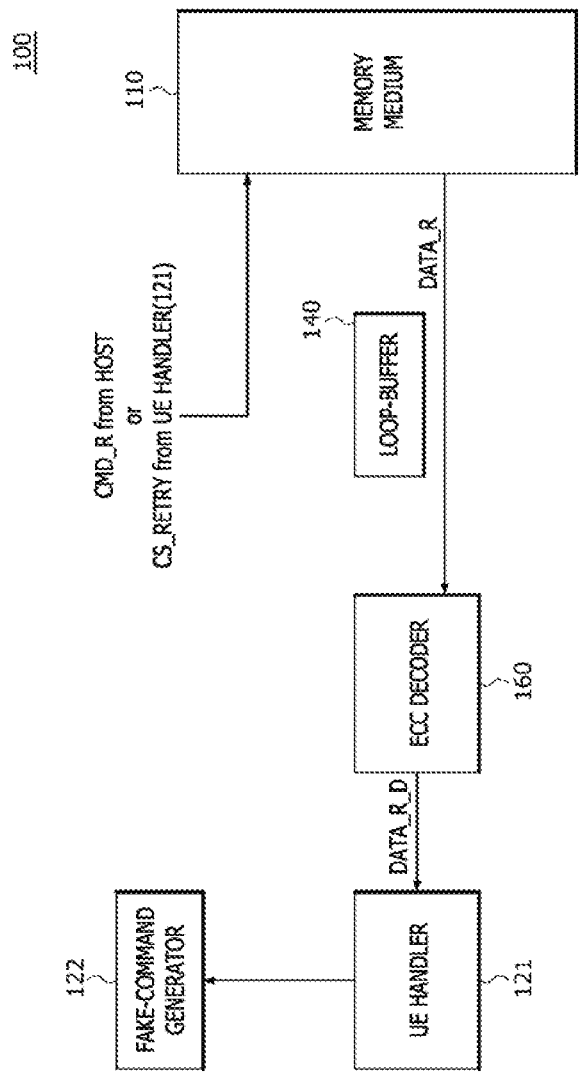
FIG. 2 is a block diagram illustrating a normal read operation or a retry operation of a memory system according to an embodiment of the present disclosure.

FIG. 2 is a block diagram illustrating the normal read operation or the retry operation of the memory system 100 according to an embodiment of the present disclosure. In FIG. 2, the same reference numerals or characters as used in FIG. 1 denote the same elements. Referring to FIG. 2, the memory system 100 may read out data stored in the memory medium 110 during the normal read operation or the retry operation. In an embodiment, the normal read operation may be performed when a read command CMD_R is generated by a host and is transmitted to the memory medium 110. In an embodiment, the retry operation may be performed when an error of the read data DATA_R is not corrected even after the ECC decoding operation of the read data DATA_R outputted from the memory medium 110 is performed during the normal read operation. In such a case, a retry control signal inducing the retry operation may be generated by the UE handler 121. In an embodiment, a voltage demarcation (VDM) method repeatedly performing a read operation with varying a read voltage may be applied to the retry operation to correct the error of the read data DATA_R. The read voltage may be a voltage for driving the memory medium 110.

The read data DATA_R outputted from the memory medium 110 by the normal read operation or the retry operation may be inputted to the ECC decoder 160. The loop-buffer 140 might not receive or output any data during the normal read operation or the retry operation. The ECC decoder 160 may perform the ECC decoding operation of the read data DATA_R and may output the result of the ECC decoding operation to the UE handler 121. During the normal read operation or the retry operation, the ECC decoding operation may be performed using the general RS algorithm system.

ECC decoded read data DATA_R_D generated by the ECC decoder 160 may be inputted to the UE handler 121. The UE handler 121 may discriminate whether all of the errors in the ECC decoded read data DATA_R_D are corrected. When all of the errors in the ECC decoded read data DATA_R_D are corrected, the UE handler 121 may transmit the ECC decoded read data DATA_R_D to the host and may terminate the read operation of the memory medium 110. In contrast, when all of the errors in the ECC decoded read data DATA_R_D are not corrected, the UE handler 121 may activate the first operation mode as an operation mode and may perform a control operation relating to the first operation mode.

Figure 3:
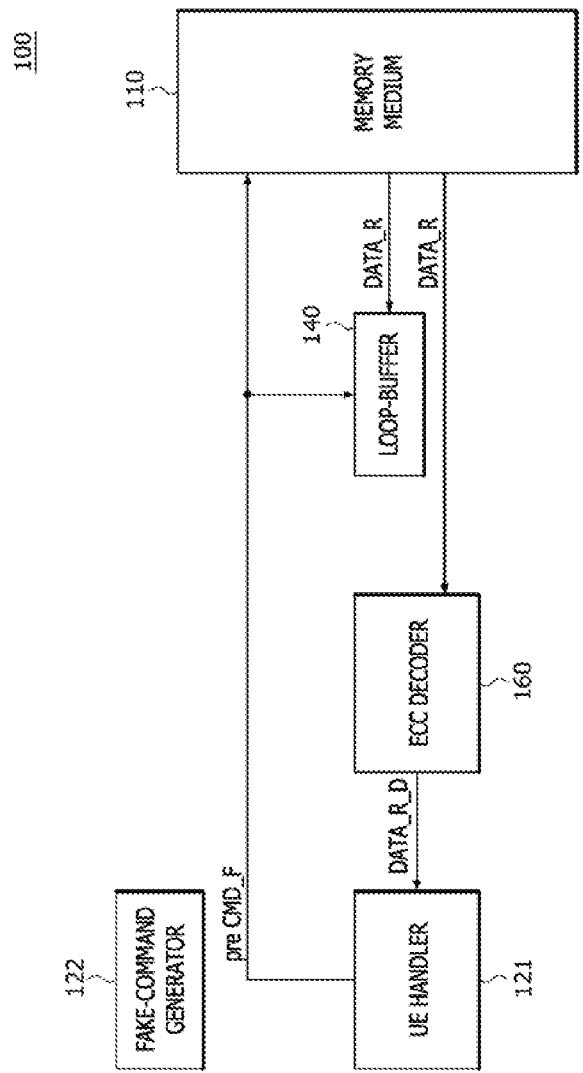
FIG. 3 is a block diagram illustrating an operation performed in a first operation mode of a memory system according to an embodiment of the present disclosure.

FIG. 3 is a block diagram illustrating an operation performed in the first operation mode of the memory system 100 according to an embodiment of the present disclosure. In FIG. 3, the same reference numerals or characters as used in FIG. 1 denote the same elements. Referring to FIG. 3, if the first operation mode is activated, the UE handler 121 may output the preliminary fake-command control signal pre_CMD_F. The preliminary fake-command control signal pre_CMD_F may be transmitted to the memory medium 110 and the loop-buffer 140. The memory medium 110 may output the read data DATA_R to the loop-buffer 140 and the ECC decoder 160 in response to the preliminary fake-command control signal pre_CMD_F. Transmitting the read data DATA_R from the memory medium 110 to the loop-buffer 140 and the transmitting the read data DATA_R from the memory medium 110 to the ECC decoder 160 may be simultaneously or sequentially performed. In an embodiment, the words "simultaneous" and "simultaneously" as used herein with respect to transmitting means that the transmissions take place on overlapping intervals of time. For example, if a first transmission takes place over a first interval of time and a second transmission takes place simultaneously over a second interval of time, then the first and second intervals at least partially overlap each other such that there exists a time at which the first and second transmissions are both taking place.

The loop-buffer 140 receiving the preliminary fake-command control signal pre_CMD_F and the read data DATA_R may only store the read data DATA_R without outputting the read data DATA_R. Thus, in the first operation mode, the ECC decoder 160 may receive the read data DATA_R from the memory medium 110. The ECC decoder 160 may perform the ECC decoding operation of the read data DATA_R outputted from the memory medium 110 and may output the result of the ECC decoding operation of the read data DATA_R to the UE handler 121. The ECC decoding operation may also be performed using the general RS algorithm system in the first operation mode like the ECC decoding operation performed during the normal read operation or the retry operation.

In the first operation mode, the ECC decoded read data DATA_R_D may be inputted to the UE handler 121 by the ECC decoder 160. The UE handler 121 may discriminate whether all of the errors in the ECC decoded read data DATA_R_D are corrected. When all of the errors in the ECC decoded read data DATA_R_D are corrected, the UE handler 121 may transmit the ECC decoded read data DATA_R_D to the host and may terminate the read operation of the memory medium 110. In contrast, when all of the errors in the ECC decoded read data DATA_R_D are not corrected, the UE handler 121 may activate the second operation mode.

Figure 4:
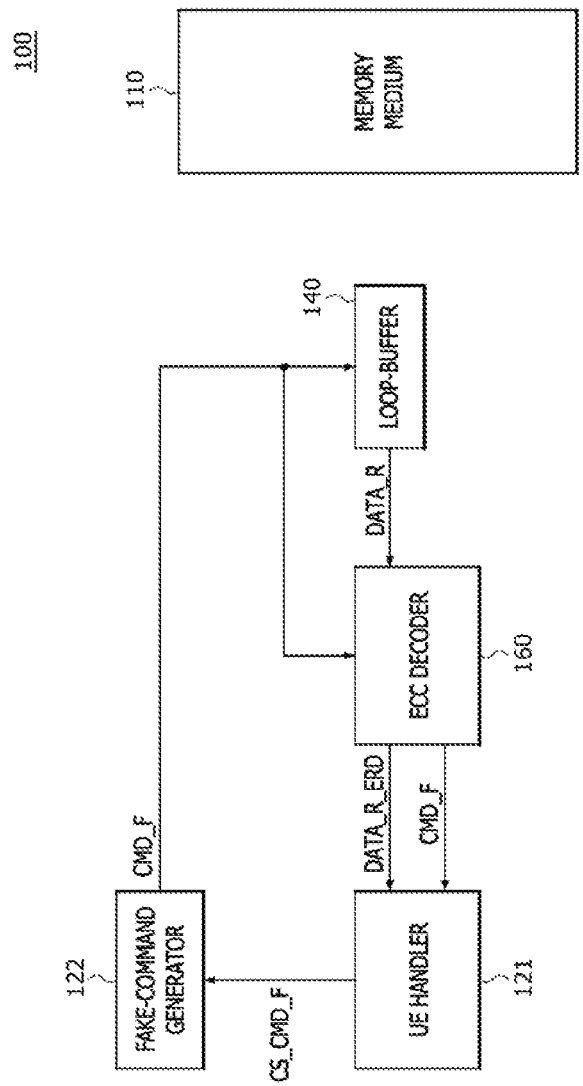
FIG. 4 is a block diagram illustrating an operation performed in a second operation mode of a memory system according to an embodiment of the present disclosure.

FIG. 4 is a block diagram illustrating an operation performed in the second operation mode of the memory system 100 according to an embodiment of the present disclosure. In FIG. 4, the same reference numerals or characters as used in FIG. 1 denote the same elements. Referring to FIG. 4, if the second operation mode is activated, the UE handler 121 may generate the fake-command control signal CS_CMD_F. The fake-command control signal CS_CMD_F may be inputted to the fake-command generator 122. The fake-command generator 122 may output the fake-command CMD_F in response to the fake-command control signal CS_CMD_F. The fake-command CMD_F may be inputted to the loop-buffer 140 and the ECC decoder 160. The loop-buffer 140 may receive the fake-command CMD_F to transmit the read data DATA_R stored in the loop-buffer 140 to the ECC decoder 160. In the second operation mode in which the fake-command CMD_F is generated, the access to the memory medium 110 may terminate. Thus, none of the read operation and the write operation of the memory medium 110 may be performed in the second operation mode.

The ECC decoder 160 may perform the ECC decoding operation of the read data DATA_R outputted from the loop-buffer 140 and may output the result of the ECC decoding operation to the UE handler 121. In the second operation mode, the ECC decoding operation may be performed using the erasure-loop method. The ECC decoding operation using the erasure-loop method may be performed using an RS code system after sequentially erasing some of the symbols constituting the read data DATA_R. The ECC decoding operation using the erasure-loop method may be iteratively performed until all of the errors are corrected or all of the symbols are erased.

ECC decoded read data DATA_R_ERD outputted from the ECC decoder 160 by the erasure-loop method may be inputted to the UE handler 121. The UE handler 121 may discriminate whether all of the errors in the ECC decoded read data DATA_R_ERD generated by the erasure-loop method are corrected. When all of the errors in the ECC decoded read data DATA_R_ERD are corrected, the UE handler 121 may transmit the ECC decoded read data DATA_R_ERD to the host. In contrast, when all of the errors in the ECC decoded read data DATA_R_ERD are not corrected, the UE handler 121 may regard an error correction procedure as a final failed state. The final failed state is defined as a state in which the read data DATA_R_ERD in the memory medium 110 cannot be corrected.

Figure 5:
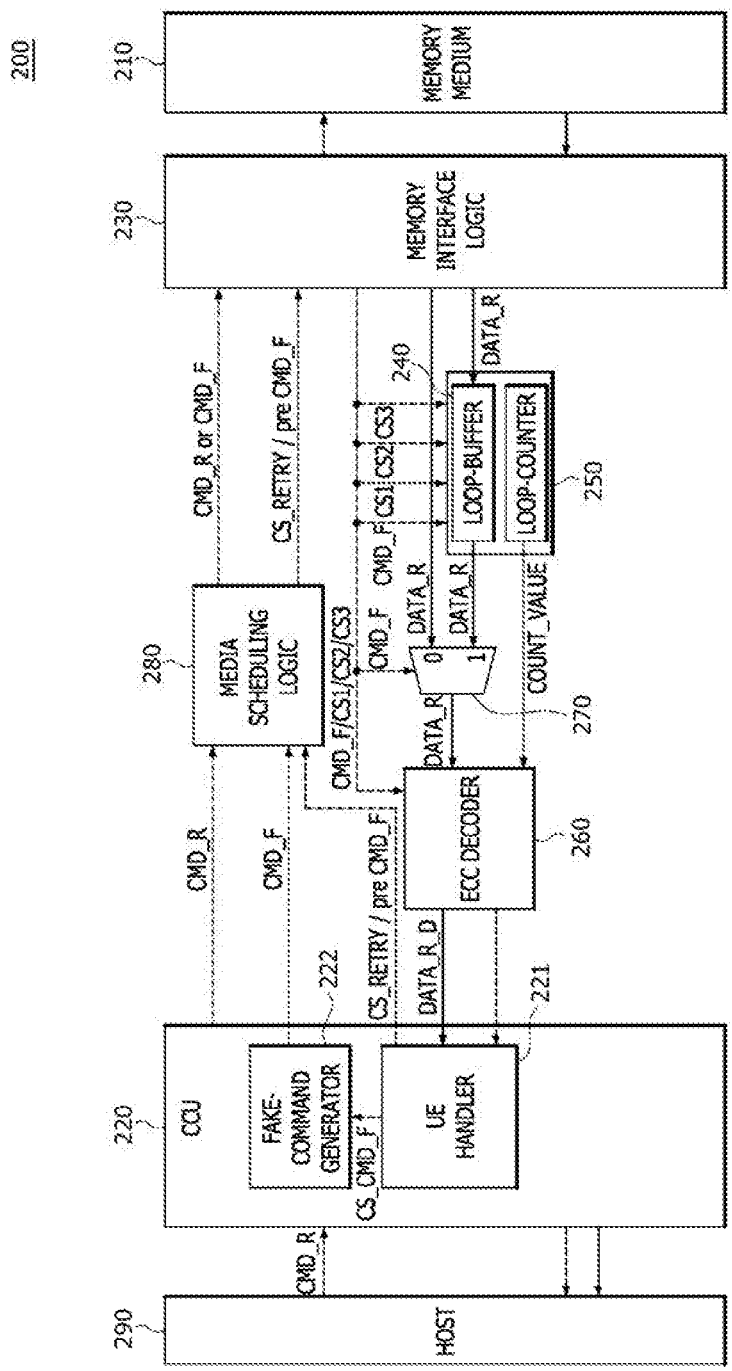
FIG. 5 is a block diagram illustrating an example of a memory system according to another embodiment of the present disclosure.
Figure 6:
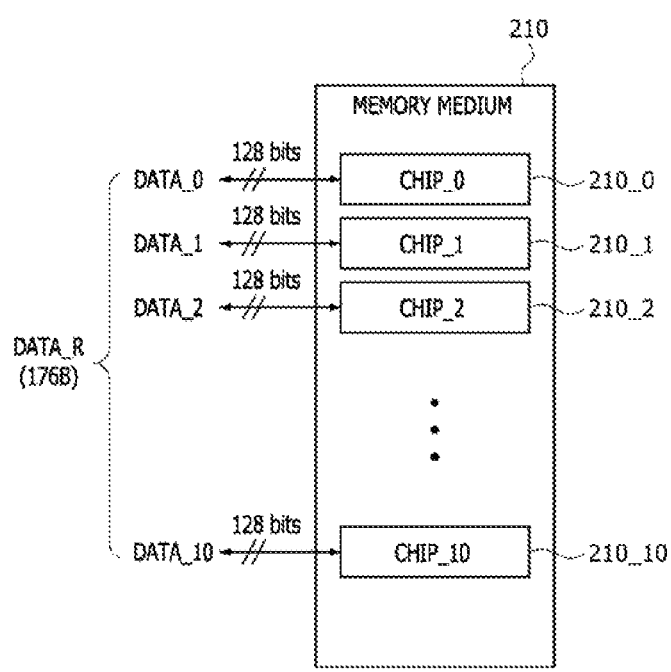
FIG. 6 is a block diagram illustrating an example of a memory medium included in the memory system of FIG. 5.
Figure 7:
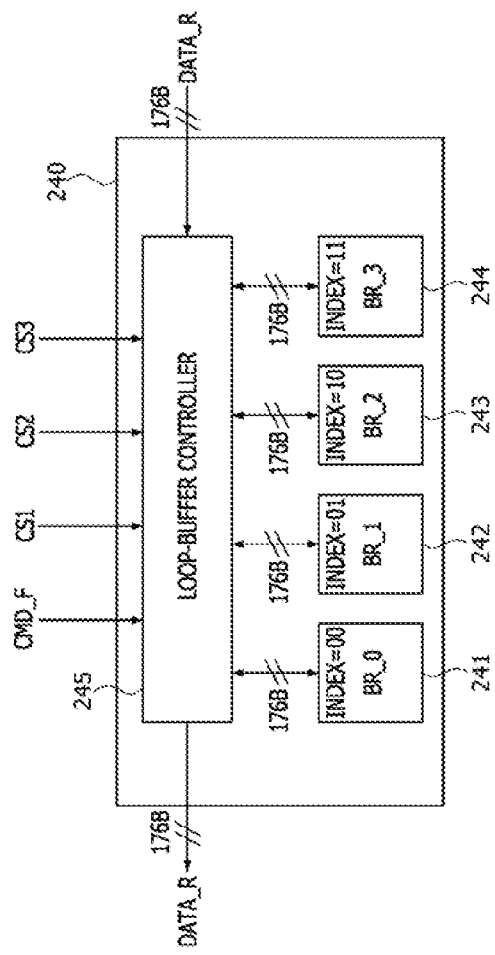
FIG. 7 is a block diagram illustrating an example of a loop-buffer included in the memory system of FIG. 5.
Figure 8:
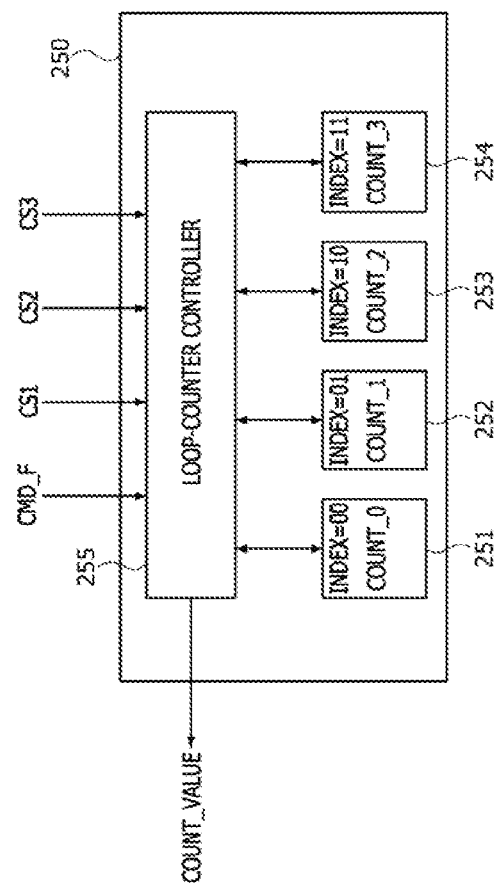
FIG. 8 is a block diagram illustrating an example of a loop-counter included in the memory system of FIG. 5.

FIG. 5 is a block diagram illustrating a memory system 200 according to another embodiment of the present disclosure. FIG. 6 is a block diagram illustrating a memory medium 210 included in the memory system 200 of FIG. 5. FIG. 7 is a block diagram illustrating a loop-buffer 240 included in the memory system 200 of FIG. 5, and FIG. 8 is a block diagram illustrating a loop-counter 250 included in the memory system 200 of FIG. 5. First, referring to FIG. 5, the memory system 200 may include a memory medium 210, a command control unit (CCU) 220, a memory interface logic circuit 230, a loop-buffer 240, a loop-counter 250, an ECC decoder 260, a multiplexer 270 and a media scheduling logic circuit 280. The memory medium 210 may include a plurality of memory chips, for example, first to eleventh memory chips 210_0, 210_1, 210_2, . . . and 210_10, as illustrated in FIG. 6. Each of the first to eleventh memory chips 210_0, 210_1, 210_2, . . . and 210_10 may receive or output data in units of 128 bits. That is, first data DATA_0 having 128 bits may be inputted to or outputted from the first memory chip 210_0, and second data DATA_1 having 128 bits may be inputted to or outputted from the second memory chip 210_1. In addition, third data DATA_2 having 128 bits may also be inputted to or outputted from the third memory chip 210_2. Similarly, eleventh data DATA_10 having 128 bits may be inputted to or outputted from the eleventh memory chip 210_10. The first to eleventh data DATA_0~FATA_10 outputted from respective ones of the first to eleventh memory chips 210_0~210_10 may constitute read data DATA_R. That is, the read data DATA_R outputted from the memory medium 210 by a read operation of the memory medium 210 may be configured to include the first to eleventh 128-bit data DATA_0~DATA_10 which are dispersed and stored in respective ones of the first to eleventh memory chips 210_0, 210_1, 210_2, . . . and 210_10. Thus, the read data DATA_R outputted from the memory medium 210 by a single read operation may be configured to have 176 bytes.

The command control unit (CCU) 220 may transmit the read command CMD_R outputted from a host 290 to the media scheduling logic circuit 280 or may generate control signals and a fake-command for controlling an ECC decoding operation of the read data DATA_R. In an embodiment, the command control unit (CCU) 220 may be configured to include a UE handler 221 and a fake-command generator 222. The UE handler 221 may generate and transmit an ECC decoded read data DATA_R_D to the host 290 when all of errors in the ECC decoded read data DATA_R_D are corrected during the normal read operation. In contrast, when all of errors in the ECC decoded read data DATA_R_D are not corrected, the UE handler 221 may generate a retry control signal CS_RETRY or a preliminary fake-command control signal pre_CMD_F.

A retry operation may be performed if the retry control signal CS_RETRY is generated, and a first operation mode may be activated if the preliminary fake-command control signal pre_CMD_F is generated. In an embodiment, the preliminary fake-command control signal pre_CMD_F may be generated together with a first signal of the retry control signal CS_RETRY. In another embodiment, the preliminary fake-command control signal pre_CMD_F may be generated together with a retry control signal for a final retry operation among a plurality of retry operations performed according to the retry control signal CS_RETRY. In yet another embodiment, the preliminary fake-command control signal pre_CMD_F may be generated together with the retry control signal CS_RETRY whenever the retry control signal CS_RETRY is generated. In still another embodiment, the preliminary fake-command control signal pre_CMD_F may be generated when the read command CMD_R are transmitted during the normal read operation. The retry control signal CS_RETRY or the preliminary fake-command control signal pre_CMD_F may be transmitted to the memory interface logic circuit 230 through the media scheduling logic circuit 280.

The UE handler 221 may transmit the ECC decoded read data DATA_R_D to the host 290 when all of errors in the ECC decoded read data DATA_R_D outputted from the memory medium 210 are corrected in the first operation mode. In contrast, the UE handler 221 may generate a fake-command control signal CS_CMD_F if all of errors in the ECC decoded read data DATA_R_D outputted from the memory medium 210 are not corrected in the first operation mode. The fake-command control signal CS_CMD_F may be inputted to the fake-command generator 222. The fake-command generator 222 may output a fake-command CMD_F in response to the fake-command control signal CS_CMD_F. The fake-command CMD_F may be transmitted to the memory interface logic circuit 230 through the media scheduling logic circuit 280.

The memory interface logic circuit 230 may control the timing of signals and may generate various control signals during the access to the memory medium 210. During the normal read operation, the memory interface logic circuit 230 may output the read data DATA_R stored in the memory medium 210 in response to the read command CMD_R transmitted from the host 290 to the memory interface logic circuit 230 through the command control unit (CCU) 220 and the media scheduling logic circuit 280. During the retry operation, the memory interface logic circuit 230 may output the read data DATA_R stored in the memory medium 210 in response to the retry control signal CS_RETRY transmitted from the command control unit (CCU) 220 to the memory interface logic circuit 230 through the media scheduling logic circuit 280. During the retry operation, the memory interface logic circuit 230 may operate using the VDM method repeatedly performing a read operation with varying a read voltage. During the first operation mode, the memory interface logic circuit 230 may output the read data DATA_R stored in the memory medium 210 in response to the preliminary fake-command control signal pre_CMD_F transmitted from the UE handler 221 to the memory interface logic circuit 230 through the media scheduling logic circuit 280. During the second operation mode, the memory interface logic circuit 230 may terminate the access to the memory medium 210 in response to the fake-command CMD_F transmitted from the fake-command generator 222 to the memory interface logic circuit 230 through the media scheduling logic circuit 280.

During the normal read operation, the retry operation, or operations performed in the first operation mode, the memory interface logic circuit 230 may transmit the read data DATA_R stored in the memory medium 210 to a first input terminal of the multiplexer 270. In the first operation mode, the memory interface logic circuit 230 may also transmit the read data DATA_R outputted from the memory medium 210 to the loop-buffer 240 in addition to the first input terminal of the multiplexer 270. In an embodiment, in the first operation mode, the memory interface logic circuit 230 may simultaneously transmit the read data DATA_R in the memory medium 210 to both of the loop-buffer 240 and the first input terminal of the multiplexer 270. In another embodiment, in the first operation mode, the memory interface logic circuit 230 may transmit the read data DATA_R to the loop-buffer 240 after transmitting the read data DATA_R to the multiplexer 270.

In the first operation mode, the memory interface logic circuit 230 may output first to third control signals CS1, CS2 and CS3 to each of the loop-buffer 240, the loop-counter 250 and the ECC decoder 260. In the second operation mode, the memory interface logic circuit 230 may output the fake-command CMD_F and the first to third control signals CS1, CS2 and CS3 to each of the loop-buffer 240, the loop-counter 250 and the ECC decoder 260. In the second operation mode, the memory interface logic circuit 230 may also output the fake-command CMD_F to a control terminal of the multiplexer 270. In the second operation mode, the memory interface logic circuit 230 might not access to the memory medium 210. Thus, the read data DATA_R are not outputted from the memory interface logic circuit 230 in the second operation mode.

In an embodiment, the first control signal CS1 may be one-bit signal having a binary value for indicating activation or inactivation of the second operation mode. In an embodiment, when the first control signal CS1 has a logic "high(1)" level, it may mean that the second operation mode is activated to generate the fake-command CMD_F. In contrast, when the first control signal CS1 has a logic "low(0)" level, it may mean that the second operation mode is inactivated. The third control signal CS3 may be one-bit signal having a binary value for indicating activation or inactivation of the first operation mode. In an embodiment, when the third control signal CS3 has a logic "high(1)" level, it may mean that first operation mode is activated. In contrast, when the third control signal CS3 has a logic "low(0)" level, it may mean that first operation mode is inactivated.

The second control signal CS2 may be a multi-bit signal indicating indexes. The indexes may designate a region of the loop-buffer 240 for storing the read data DATA_R and may designate a target which is reset in the loop-counter 250, in the first operation mode. In addition, the indexes may designate a region in which the read data DATA_R to be outputted from the loop-buffer 240 is stored and may designate a target having a count value COUNT_VALUE to be outputted from the loop-counter 250, in the second operation mode. The number of bits constituting the second control signal CS2 may be determined according to the number of storage regions which are capable of storing the read data DATA_R in the loop-buffer 240. For example, when the loop-buffer 240 has four storage regions which are capable of storing the read data DATA_R, the second control signal CS2 may be a 2-bit signal.

The loop-buffer 240 may be configured to include a plurality of buffer regions (e.g., first to fourth buffer regions (BR_0, BR_1, BR_2 and BR_3) 241~244) and a loop-buffer controller 245, as illustrated in FIG. 7. The first to fourth buffer regions 241~244 may be distinguished from each other by their own indexes. In an embodiment, the first to fourth buffer regions 241~244 may have indexes of "00", "01", "10" and "11", respectively. The first to fourth buffer regions 241~244 may function as storage spaces which are capable of storing the read data DATA_R outputted from the memory medium 210. As described with reference to FIG. 6, when the read data DATA_R outputted from the memory medium 210 are comprised of the first to eleventh 128-bit data DATA_0~DATA_10 dispersed and stored in respective ones of the first to eleventh memory chips 210_0~210_10, each of the first to fourth buffer regions 241~244 may store the read data DATA_R having 176 bytes, which are comprised of the first to eleventh data DATA_0~DATA_10. Thus, each of the first to fourth buffer regions 241~244 may have a storage capacity which is equal to or greater than an amount of the read data DATA_R, for example, 176 bytes.

The loop-buffer controller 245 included in the loop-buffer 240 may control an operation for storing the read data DATA_R into a buffer region having a designated index or an operation for outputting the read data DATA_R stored in a buffer region having a designated index in response to the fake-command CMD_F and the first to third control signals CS1~CS3 inputted to the loop-buffer 240. Accordingly, the loop-buffer 240 may operate only in the first and second operation modes and might not operate during the normal read operation and the retry operation because of the control operation of the loop-buffer controller 245 described above.

The loop-buffer controller 245 may receive the third control signal CS3 to discriminate whether the first operation mode is activated. For example, if the third control signal CS3 having a logic level (e.g., a logic "high(1)" level) indicating the first operation mode is transmitted from the memory interface logic circuit 230 to the loop-buffer controller 245, the loop-buffer controller 245 may perform an operation for storing the read data DATA_R. In such case, a buffer region in which the read data DATA_R are stored may be determined by the second control signal CS2. For example, if the third control signal CS3 has a logic "high(1)" level and the second control signal CS2 has a logic level combination of "10", the loop-buffer controller 245 may regard the operation mode as the first operation mode and may store the read data DATA_R outputted from the memory medium 210 through the memory interface logic circuit 230 into the third buffer region 243 having an index of "10" among the first to fourth buffer regions 241~244 of the loop-buffer 240.

The loop-buffer controller 245 may receive the face command CMD_F and the first control signal CS1 to discriminate whether the second operation mode is activated. For example, if the first control signal CS1 having a logic level (e.g., a logic "high(1)" level) indicating the second operation mode is transmitted from the memory interface logic circuit 230 to the loop-buffer controller 245 and the fake command CMD_F is transmitted from the memory interface logic circuit 230 to the loop-buffer controller 245, the loop-buffer controller 245 may perform an operation for outputting the read data DATA_R. In such case, a buffer region in which the read data DATA_R to be outputted are stored may be determined by the second control signal CS2. For example, if the first control signal CS1 having a logic "high(1)" level and the second control signal CS2 having a logic level combination of "10" are inputted to the loop-buffer controller 245 with the fake command CMD_F, the loop-buffer controller 245 may regard the operation mode as the second operation mode and may output the read data DATA_R stored in the third buffer region 243 having an index of "10" among the first to fourth buffer regions 241~244 of the loop-buffer 240.

The loop-counter 250 may be configured to include a plurality of counters (e.g., first to fourth counters (COUNT_0, COUNT_1, COUNT_2 and COUNT_3) 251~254) and a loop-counter controller 255, as illustrated in FIG. 8. The first to fourth counters 251~254 may be distinguished from each other by their own indexes. In an embodiment, the first to fourth counters 251~254 may have indexes of "00", "01", "10" and "11", respectively. The indexes of the first to fourth counters 251~254 may correspond to the indexes of the first to fourth buffer regions 241~244, respectively. Thus, the number of the counters of the loop-counter 250 may be equal to the number of the buffer regions of the loop-buffer 240. Specifically, the first counter 251 may perform a counting operation for the first buffer region 241 of the loop-buffer 240, and the second counter 252 may perform a counting operation for the second buffer region 242 of the loop-buffer 240. Similarly, the third counter 253 may perform a counting operation for the third buffer region 243 of the loop-buffer 240, and the fourth counter 254 may perform a counting operation for the fourth buffer region 244 of the loop-buffer 240.

The loop-counter controller 255 included in the loop-counter 250 may control a reset operation or a count value output/count operation of a counter designated by the second control signal CS2 among the first to fourth counters 251~254 in response to the fake-command CMD_F and the first to third control signals CS1~CS3 inputted to the loop-counter 250. The loop-counter 250 may operate only in the first and second operation modes and might not operate during the normal read operation and the retry operation because of the control operation of the loop-counter controller 255 described above.

The loop-counter controller 255 may receive the third control signal CS3 to discriminate whether the first operation mode is activated. For example, if the third control signal CS3 having a logic level (e.g., a logic "high(1)" level) indicating the first operation mode is transmitted from the memory interface logic circuit 230 to the loop-counter controller 255, the loop-counter controller 255 may perform the reset operation of a counter designated by the index of the second control signal CS2 among the first to fourth counters 251~254. The count value COUNT VALUE of the counter which is reset by the reset operation may be initialized. For example, if the third control signal CS3 has a logic "high(1)" level and the second control signal CS2 has a logic level combination of "10", the loop-counter controller 255 may regard the operation mode as the first operation mode and may reset the third counter 253 having an index of "10" among the first to fourth counters 251~254 of the loop-counter 250.

The loop-counter controller 255 may receive the face command CMD_F and the first control signal CS1 to discriminate whether the second operation mode is activated. For example, if the first control signal CS1 having a logic level (e.g., a logic "high(1)" level) indicating the second operation mode is transmitted from the memory interface logic circuit 230 to the loop-counter controller 255 and the fake command CMD_F is transmitted from the memory interface logic circuit 230 to the loop-counter controller 255, the loop-counter controller 255 may perform a count value output/count operation of a counter designated by the second control signal CS2 among the first to fourth counters 251~254. For example, if the first control signal CS1 having a logic "high(1)" level and the second control signal CS2 having a logic level combination of "10" are inputted to the loop-counter controller 255 with the fake command CMD_F, the loop-counter controller 255 may regard the operation mode as the second operation mode and may perform a counting operation for outputting the count value COUNT_VALUE of the third counter 253 having an index of "10" and for increasing the count value COUNT_VALUE of the third counter 253 by one. Although the present embodiment is described in conjunction with a case that the count value COUNT_VALUE of the counter is outputted through the loop-counter controller 255, the present disclosure is not limited thereto. In some other embodiments, the count value COUNT_VALUE of the counter may be directly outputted from the loop-counter 250 without being transferred through the loop-counter controller 255 and only the counting operation of the counters may be performed by the loop-counter controller 255.

The count value COUNT_VALUE of each of the first to fourth counters 251~254 may indicate a symbol to be erased during the ECC decoding operation using the erasure-loop method in the second operation mode. As illustrated in FIG. 6, the read data DATA_R outputted from the memory medium 210 may be comprised of the first to eleventh data DATA_0, DATA_1, DATA_2, . . . and DATA_10 outputted from respective ones of the first to eleventh memory chips 210_0, 210_1, 210_2, . . . and 210_10. The ECC decoding operation using the erasure-loop method for the read data DATA_R may be performed by the same number of times as at least the number of the first to eleventh data DATA_0, DATA_1, DATA_2, ... and DATA_10 constituting the read data DATA_R until the errors are corrected. Thus, eleven ECC decoding operations may be sequentially performed from an ECC decoding operation of a first loop to an ECC decoding operation of an eleventh loop with changing the symbols which are erased.

Specifically, the ECC decoding operation of the first loop may be performed after erasing first symbols comprised of the first data DATA_0 outputted from the first memory chip 210_0. In such a case, the count value COUNT_VALUE outputted from the loop-counter 250 may have a binary number designating the first symbols to be erased. Next, the ECC decoding operation of the second loop may be performed after erasing second symbols comprised of the second data DATA_1 outputted from the second memory chip 210_1. In such a case, the count value COUNT_VALUE outputted from the loop-counter 250 may have a binary number designating the second symbols to be erased. Similarly, the ECC decoding operation of the third loop may be performed after erasing third symbols comprised of the third data DATA_2 outputted from the third memory chip 210_2. In such a case, the count value COUNT_VALUE outputted from the loop-counter 250 may have a binary number designating the third symbols to be erased. In this way, the count value COUNT_VALUE having a binary number designating a symbol to be erased may be outputted from the loop-counter 250 whenever the ECC decoding operations of the fourth to eleventh loops are performed.

The number of bits included in a binary number of the count value COUNT_VALUE of each of the first to fourth counters 251~254 may be determined according to the number of times that the ECC decoding operation using the erasure-loop method is performed. Like the present embodiment, when the ECC decoding operation is performed eleven times from the ECC decoding operation of the first loop to the ECC decoding operation of the eleventh loop, the count value COUNT_VALUE may be comprised of a 4-bit binary number to designate all of symbols to be erased. In such a case, the count value COUNT_VALUE of "0000" may designate first symbols comprised of the first data DATA_0 outputted from the first memory chip 210_0, and the count value COUNT_VALUE of "0001" may designate second symbols comprised of the second data DATA_1 outputted from the second memory chip 210_1. In this way, the count value COUNT_VALUE of "1010" may designate eleventh symbols comprised of the eleventh data DATA_10 outputted from the eleventh memory chip 210_10.

Although not shown in the drawings, the ECC decoder 260 may be configured to include a syndrome arithmetic element, an error location polynomial arithmetic element, an error location arithmetic element and an error correction arithmetic element, as well known in the art. The ECC decoder 260 may perform the ECC decoding operation of the read data DATA_R to correct errors included in read data DATA_R. The ECC decoder 260 may receive the read data DATA_R from the multiplexer 270. The ECC decoder 260 may output the ECC decoded read data DATA_R_D to the UE handler 221 of the command control unit (CCU) 220. The ECC decoder 260 may receive the fake command CMD_F and the first to third control signals CS1~CS3 from the memory interface logic circuit 230. The ECC decoder 260 may receive the count value COUNT_VALUE from the loop-counter 250.

While the normal read operation or the retry operation is performed or the first operation mode is activated, the ECC decoder 260 may perform an ECC decoding operation of the read data DATA_R outputted from the multiplexer 270. In such a case, the ECC decoding operation may be performed using a general RS algorithm system. As described with reference to FIG. 8, the count value COUNT_VALUE is not generated by the loop-counter 250 during the normal read operation, the retry operation and some operations in the first operation mode. Thus, during the normal read operation, the retry operation and some operations in the first operation mode, the ECC decoder 260 may perform only the ECC decoding operation using the general RS algorithm system and might not perform the ECC decoding operation using the erasure-loop method. In the second operation mode, the ECC decoder 260 may perform the ECC decoding operation using the erasure-loop method for the read data DATA_R outputted from the multiplexer 270. In the second operation mode, the ECC decoder 260 may perform the ECC decoding operation after erasing the symbols which are designated by the count values COUNT_VALUE outputted from the loop-counter 250. The second operation mode in which the ECC decoding operation using the erasure-loop method is performed may be maintained until the errors of the read data DATA_R are corrected during the ECC decoding operation using the erasure-loop method or the read data DATA_R are finally regarded as uncorrectable data after the ECC decoding operations of all loops are performed.

The multiplexer 270 may have a first input terminal (denoted by "0" in FIG. 5) and a second input terminal (denoted by "1" in FIG. 5). The multiplexer 270 may receive the read data DATA_R from the memory medium 210 through the first input terminal "0". The multiplexer 270 may receive the read data DATA_R stored in the loop-buffer 240 through the second input terminal "1". The multiplexer 270 may selectively output one of the read data DATA_R inputted to the first input terminal "0" and the read data DATA_R inputted to the second input terminal "1" to the ECC decoder 260 according to the presence or absence of the fake command CMD_F inputted to the control terminal of the multiplexer 270. Specifically, if the fake command CMD_F is not inputted to the control terminal of the multiplexer 270, the multiplexer 270 may selectively output the read data DATA_R inputted to the first input terminal "0" to the ECC decoder 260. Because the fake command CMD_F is generated in the second operation mode, the read data DATA_R read out from the memory medium 210 may be outputted through the multiplexer 270 during the normal read operation, the retry operation and some operations executed in the first operation mode. In contrast, if the fake command CMD_F is inputted to the control terminal of the multiplexer 270, the multiplexer 270 may selectively output the read data DATA_R inputted to the second input terminal "1" to the ECC decoder 260. Because the fake command CMD_F is generated in the second operation mode, the read data DATA_R stored in the loop-buffer 240 may be outputted through the multiplexer 270 in the second operation mode.

The media scheduling logic circuit 280 may receive commands and control signals from the command control unit (CCU) 220 and may transmit the commands and control signals to the memory interface logic circuit 230 at an appropriate timing according to a state of the memory medium 210. Specifically, the media scheduling logic circuit 280 may transmit the read command CMD_R or a write command outputted from the host 290 through the command control unit (CCU) 220 to the memory interface logic circuit 230. The media scheduling logic circuit 280 may transmit the fake command CMD_F from the fake-command generator 222 of the command control unit (CCU) 220 to the memory interface logic circuit 230. The media scheduling logic circuit 280 may transmit the retry control signal CS_RETRY or the preliminary fake-command control signal pre_CMD_F from the UE handler 221 of the command control unit (CCU) 220 to the memory interface logic circuit 230.

Figure 9:
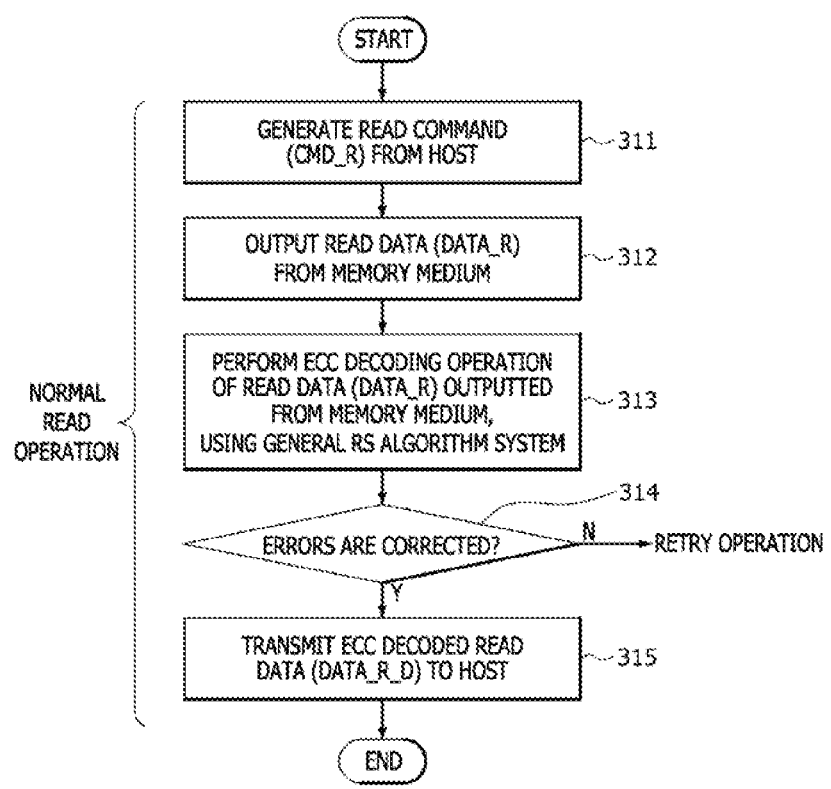
FIG. 9 is a flowchart illustrating a normal read operation of a memory system according to an embodiment of the present disclosure.
Figure 10:
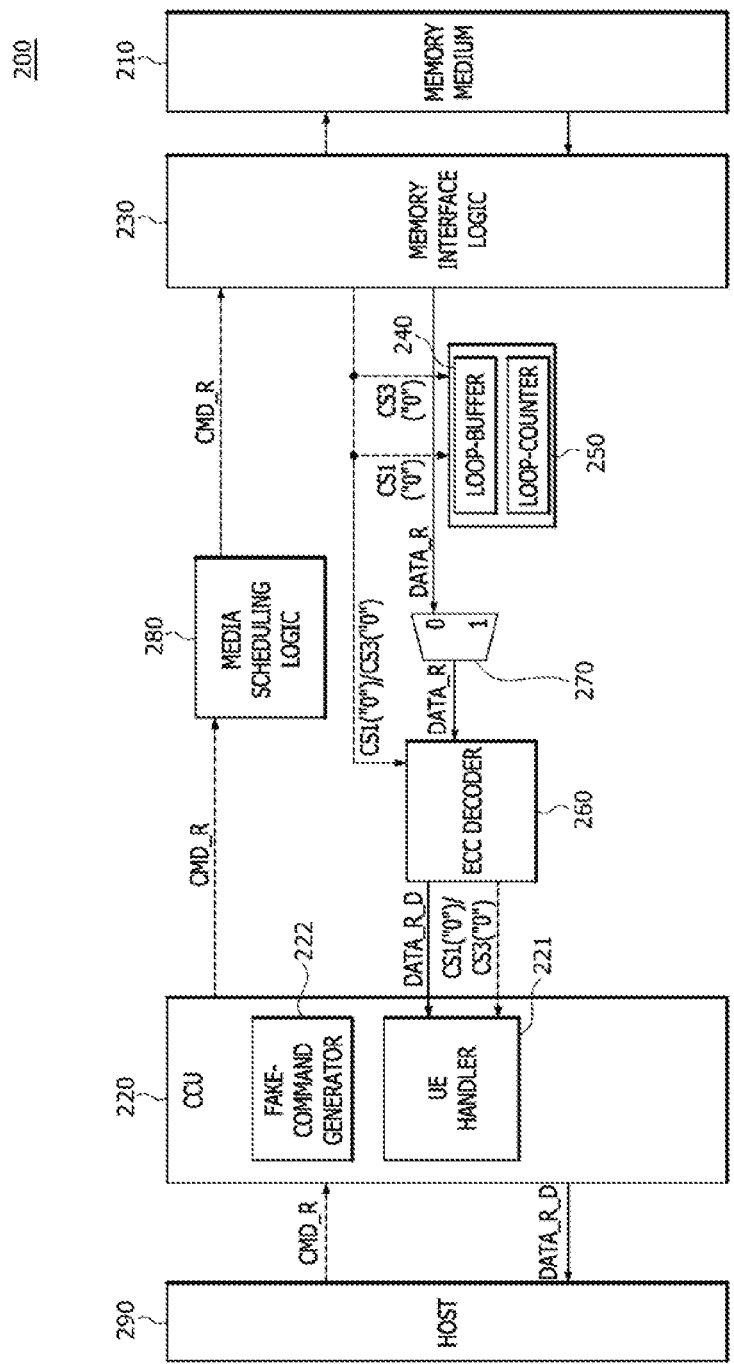
FIG. 10 is a block diagram illustrating a normal read operation of a memory system according to an embodiment of the present disclosure.

FIG. 9 is a flowchart illustrating the normal read operation of the memory system 200, and FIG. 10 is a block diagram illustrating the normal read operation of the memory system 200. In FIG. 10, the same reference numerals or characters as used in FIG. 5 denote the same elements. Referring to FIGS. 9 and 10, if the read command CMD_R is generated from the host 290 at a step 311, the memory system 200 may perform the normal read operation. Specifically, the command control unit (CCU) 220 may receive the read command CMD_R from the host 290 to transmit the read command CMD_R to the memory interface logic circuit 230 through the media scheduling logic circuit 280. During this process, the media scheduling logic circuit 280 may change a form of the read command CMD_R generated from the host 290 into another form which is able to be processed in the memory interface logic circuit 230. Although not shown in the drawings, the host 290 may also output an address with the read command CMD_R.

At a step 312, the memory interface logic circuit 230 may access to the memory medium 210 in response to the read command CMD_R. This process may be executed by accessing to a plurality of memory chips (e.g., the first to eleventh memory chips 210_0~210_10) constituting the memory medium 210, as described with reference to FIG. 6. Specifically, the memory interface logic circuit 230 may transmit the read data DATA_R from the memory medium 210 to the ECC decoder 260 through the multiplexer 270. The memory interface logic circuit 230 may output the read data DATA_R to the first input terminal "0" of the multiplexer 270 and may also output the first control signal CS1 having a logic "low(0)" level and the third control signal CS3 having a logic "low(0)" level to each of the loop-buffer 240, the loop-counter 250 and the ECC decoder 260. Because both of the first and third control signals CS1 and CS3 have a logic "low(0)" level, the loop-buffer 240 and the loop-counter 250 do not operate. Because the fake command CMD_F is not inputted to the control terminal of the multiplexer 270, the multiplexer 270 may output the read data DATA_R inputted to the first input terminal "0" to the ECC decoder 260.

At a step 313, the ECC decoder 260 may perform the ECC decoding operation of the read data DATA_R outputted from the memory medium 210. During this process, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first and third control signals CS1 and CS3 in addition to the ECC decoded read data DATA_R_D to the UE handler 221.

At a step 314, the UE handler 221 may receive the ECC decoded read data DATA_R_D to discriminate whether errors of the read data DATA_R are corrected. If the ECC decoded read data DATA_R_D are regarded as corrected data of the read data DATA_R at the step 314, the UE handler 221 may transmit the ECC decoded read data DATA_R_D to the host 290 and may terminate the read operation for outputting the read data DATA_R from the memory medium 210 (see a step 315). In contrast, if the ECC decoded read data DATA_R_D are regarded as erroneous data of the read data DATA_R at the step 314, the retry operation may be performed.

Figure 11:
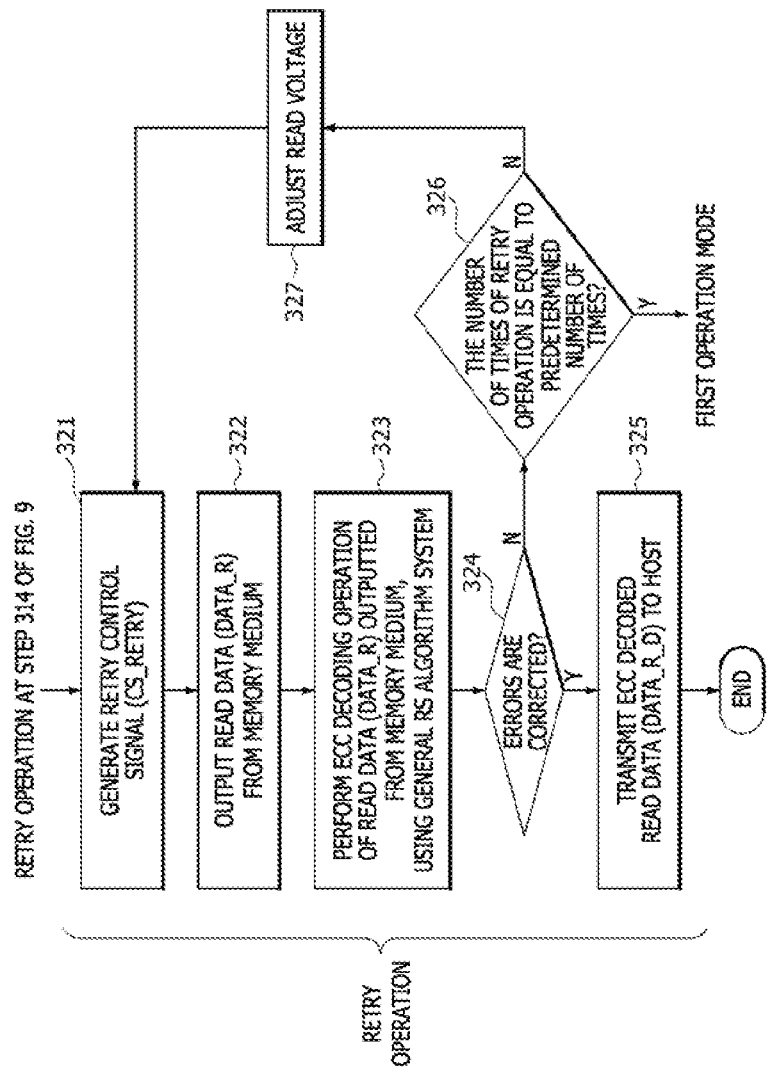
FIG. 11 is a flowchart illustrating a retry operation of a memory system according to an embodiment of the present disclosure.
Figure 12:
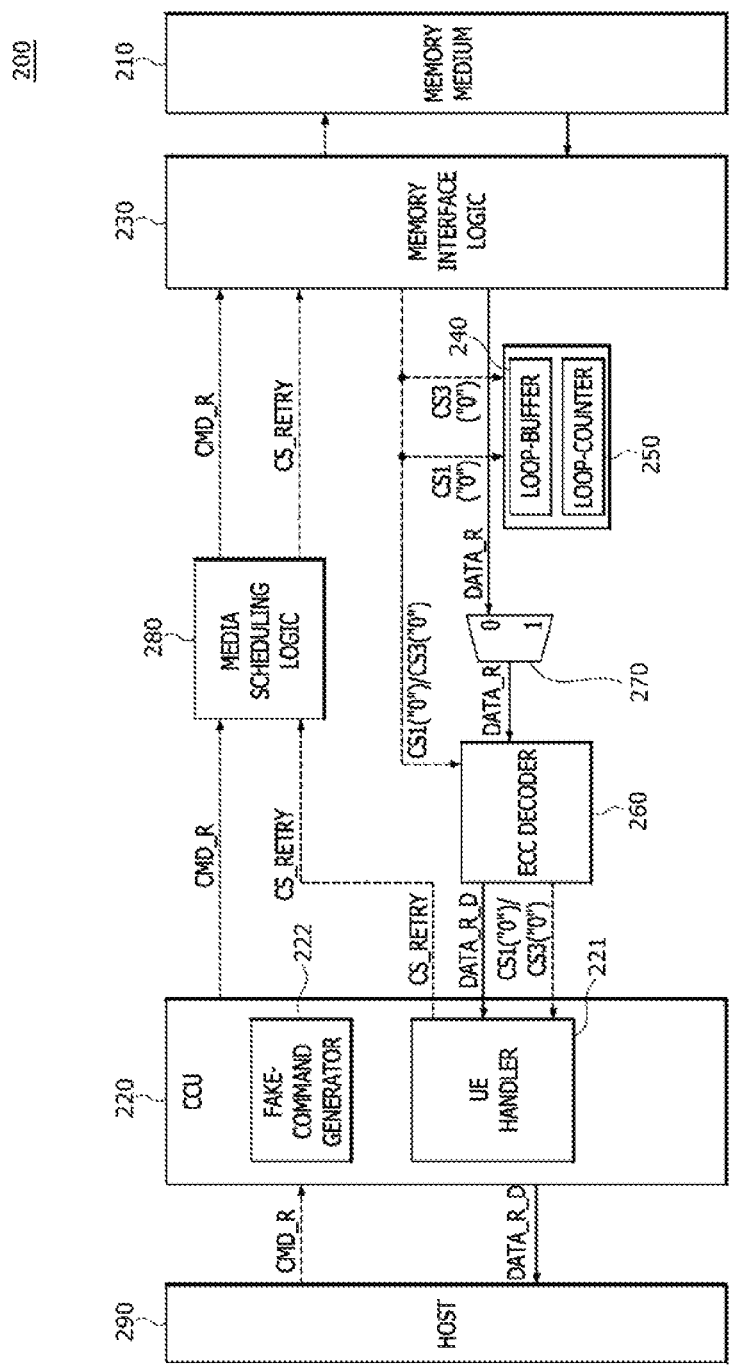
FIG. 12 is a block diagram illustrating a retry operation of a memory system according to an embodiment of the present disclosure.

FIG. 11 is a flowchart illustrating the retry operation of the memory system 200, and FIG. 12 is a block diagram illustrating the retry operation of the memory system 200. In FIG. 12, the same reference numerals or characters as used in FIG. 5 denote the same elements. In the present embodiment, the retry operation may be defined as a process that iteratively executes the ECC decoding operation by a predetermined number of times to correct errors of the read data DATA_R when the errors of the read data DATA_R are not corrected by the normal read operation. Referring to FIGS. 11 and 12, the UE handler 221 may output the retry control signal CS_RETRY at a step 321. The retry control signal CS_RETRY may be transmitted to the memory interface logic circuit 230 through the media scheduling logic circuit 280. At a step 322, the memory interface logic circuit 230 may access to the memory medium 210 in response to the retry control signal CS_RETRY. This process may be the same as the process that the memory interface logic circuit 230 accesses to the memory medium 210 in response to the read command CMD_R.

The memory interface logic circuit 230 may transmit the read data DATA_R from the memory medium 210 to the ECC decoder 260 through the multiplexer 270. Specifically, the memory interface logic circuit 230 may output the read data DATA_R to the first input terminal "0" of the multiplexer 270 and may also output the first control signal CS1 having a logic "low(0)" level and the third control signal CS3 having a logic "low(0)" level to each of the loop-buffer 240, the loop-counter 250 and the ECC decoder 260. Because both of the first and third control signals CS1 and CS3 have a logic "low(0)" level like the normal read operation, the loop-buffer 240 and the loop-counter 250 do not operate. Because the fake command CMD_F is not inputted to the control terminal of the multiplexer 270, the multiplexer 270 may output the read data DATA_R inputted to the first input terminal "0" to the ECC decoder 260.

At a step 323, the ECC decoder 260 may perform the ECC decoding operation of the read data DATA_R outputted from the memory medium 210. As executed during the normal read operation, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first and third control signals CS1 and CS3 in addition to the ECC decoded read data DATA_R_D to the UE handler 221.

At a step 324, the UE handler 221 may receive the ECC decoded read data DATA_R_D to discriminate whether errors of the read data DATA_R are corrected. If the ECC decoded read data DATA_R_D are regarded as corrected data of the read data DATA_R at the step 324, the UE handler 221 may transmit the ECC decoded read data DATA_R_D to the host 290 and may terminate the read operation for outputting the read data DATA_R from the memory medium 210 (see a step 325). In contrast, if the ECC decoded read data DATA_R_D are regarded as erroneous data of the read data DATA_R at the step 324, whether the number of times of the retry operation is equal to a predetermined number of times may be discriminated at a step 326. In an embodiment, the number of times of the retry operation may be predetermined and may be set to be different according to the error correction capability. For example, if the error correction capability becomes larger (i.e., the number of correctable symbols increases at a design stage), the number of times that the retry operation is iteratively performed may be set to be reduced. In contrast, if the error correction capability becomes smaller (i.e., the number of correctable symbols is reduced at a design stage), the number of times that the retry operation is iteratively performed may be set to increase.

If the number of times that the retry operation is iteratively performed is equal to a predetermined number of times at a step 326, the first operation mode may be activated. If the number of times that the retry operation is iteratively performed is less than the predetermined number of times at a step 326, the read voltage may be adjusted at a step 327. In an embodiment, as the number of times of the retry operation increases, the read voltage may be adjusted to be higher in order to increase the error correction possibility. After the read voltage is adjusted at the step 327, the process may be fed back to the step 321 such that the UE handler 221 outputs the retry control signal CS_RETRY at the step 321. A subsequent process may be the same as described above. The retry operation may be iteratively performed until the errors of the read data DATA_R are corrected during the retry operation or the number of times that the retry operation is iteratively performed is equal to the predetermined number of times. The word "predetermined" as used herein with respect to a parameter, such as a predetermined number of times, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 13:
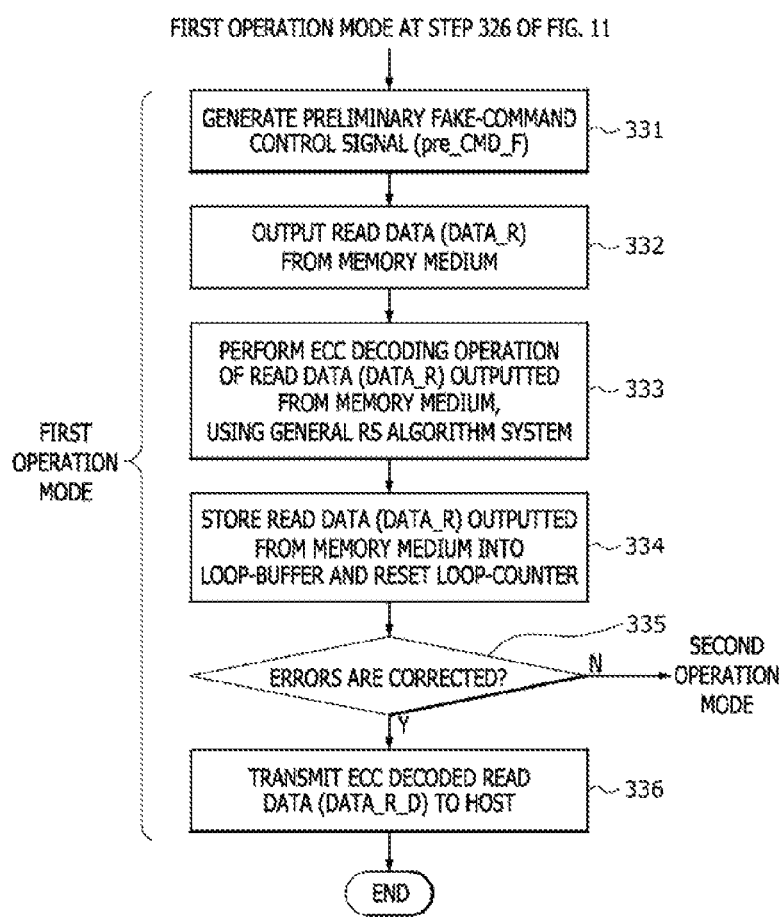
FIG. 13 is a flowchart illustrating an operation performed in a first operation mode of a memory system according to an embodiment of the present disclosure.
Figure 14:
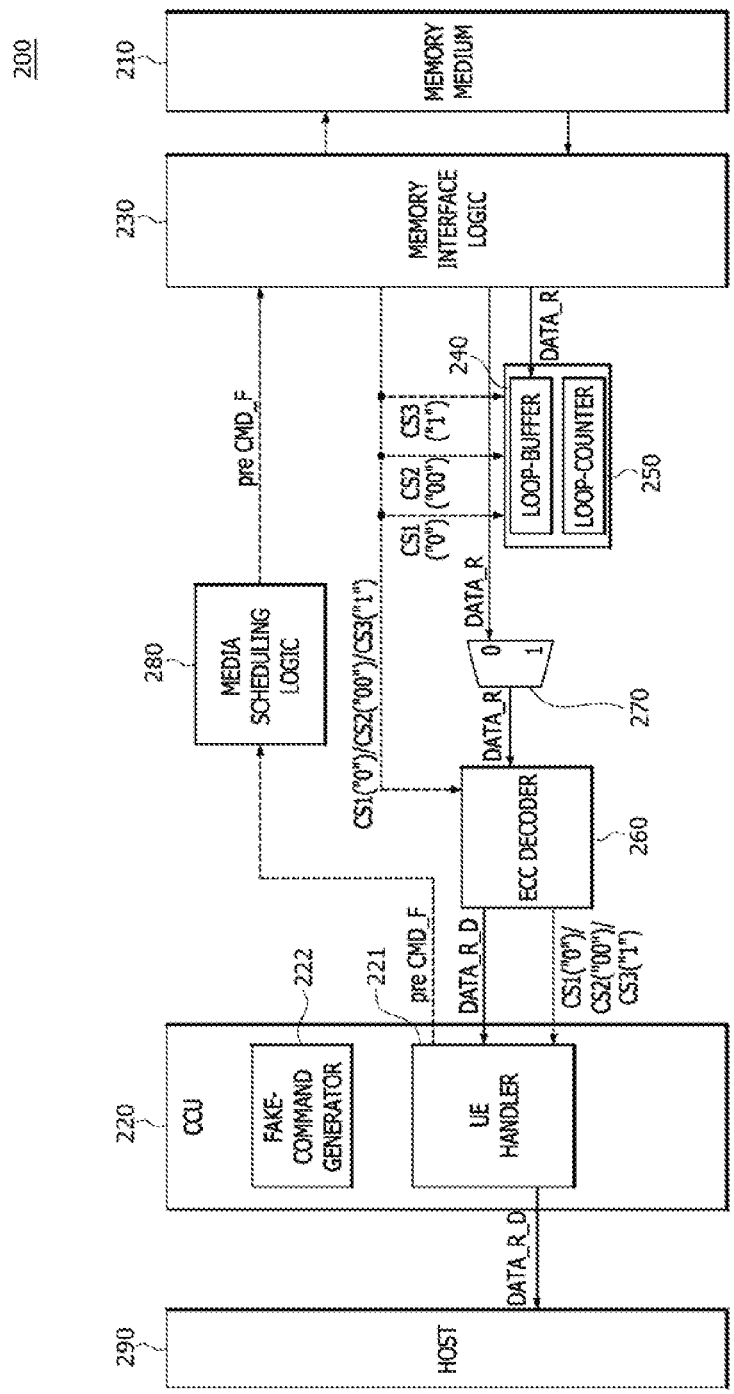
FIG. 14 is a block diagram illustrating an operation performed in a first operation mode of a memory system according to an embodiment of the present disclosure.

FIG. 13 is a flowchart illustrating operations performed in the first operation mode of the memory system 200, and FIG. 14 is a block diagram illustrating operations performed in the first operation mode of the memory system 200. In FIG. 14, the same reference numerals or characters as used in FIG. 5 denote the same elements. In the present embodiment, the first operation mode may be defined as a preliminary process for activating the second operation mode when the errors of the read data DATA_R are not corrected even by the retry operation iteratively performed. Referring to FIGS. 13 and 14, the UE handler 221 may output the preliminary fake-command control signal pre_CMD_F at a step 331. The preliminary fake-command control signal pre_CMD_F may be transmitted to the memory interface logic circuit 230 through the media scheduling logic circuit 280. At a step 332, the memory interface logic circuit 230 may access to the memory medium 210 in response to the preliminary fake-command control signal pre_CMD_F. This process may be the same as the process that the memory interface logic circuit 230 accesses to the memory medium 210 in response to the read command CMD_R or the retry control signal CS_RETRY.

The memory interface logic circuit 230 may transmit the read data DATA_R from the memory medium 210 to the ECC decoder 260 through the multiplexer 270. In addition, the memory interface logic circuit 230 may transmit the read data DATA_R from the memory medium 210 to the loop-buffer 240. Specifically, the memory interface logic circuit 230 may output the read data DATA_R to the first input terminal "0" of the multiplexer 270. In such a case, because the fake command CMD_F is not inputted to the control terminal of the multiplexer 270, the multiplexer 270 may output the read data DATA_R inputted to the first input terminal "0" to the ECC decoder 260.

The memory interface logic circuit 230 may output the first control signal CS1 having a logic "low(0)" level and the third control signal CS3 having a logic "low(0)" level to each of the loop-buffer 240, the loop-counter 250 and the ECC decoder 260. Because the first control signal CS1 has a logic "low(0)" level, the ECC decoder 260 may perform the ECC decoding operation of the read data DATA_R using the general RS algorithm system at a step 333 as described about the normal read operation and the retry operation. Meanwhile, because the third control signal CS3 has a logic "high(1)" level, the read data DATA_R may be stored into the loop-buffer 240 and the loop-counter 250 may be reset at a step 334. Although the steps 333 and 334 are illustrated with two separate blocks in FIG. 13, the steps 333 and 334 may be simultaneously performed in some embodiments.

The step 333 will be described in more detail hereinafter. The ECC decoder 260 may perform the ECC decoding operation of the read data DATA_R outputted from the memory medium 210. As described about the normal read operation or the retry operation, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first and third control signals CS1 and CS3 in addition to the ECC decoded read data DATA_R_D to the UE handler 221.

The step 334 will be described in more detail hereinafter. The loop-buffer 240 may receive the second control signal CS2 having a logic level combination of "00" and the third control signal CS3 having a logic "high(1)" level to store the read data DATA_R outputted from the memory medium 210. As described with reference to FIG. 7, the read data DATA_R may be stored into the first buffer region 241 having an index of "00" designated by the second control signal CS2 through a control operation of the loop-counter controller 255 included in the loop-counter 250. In addition, as described with reference to FIG. 8, the loop-counter 250 may receive the second control signal CS2 having a logic level combination of "00" and the third control signal CS3 having a logic "high(1)" level to reset the first counter 251 having an index of "00" designated by the second control signal CS2 through a control operation of the loop-counter controller 255.

At a step 335, the UE handler 221 may receive the ECC decoded read data DATA_R_D to discriminate whether the errors of the read data DATA_R are corrected. If the ECC decoded read data DATA_R_D are regarded as corrected data of the read data DATA_R at the step 335, the UE handler 221 may transmit the ECC decoded read data DATA_R_D to the host 290 and may terminate the read operation for outputting the read data DATA_R from the memory medium 210 (see a step 336). In contrast, if the ECC decoded read data DATA_R_D are regarded as erroneous data of the read data DATA_R at the step 335, the second operation mode may be activated.

Figure 15:
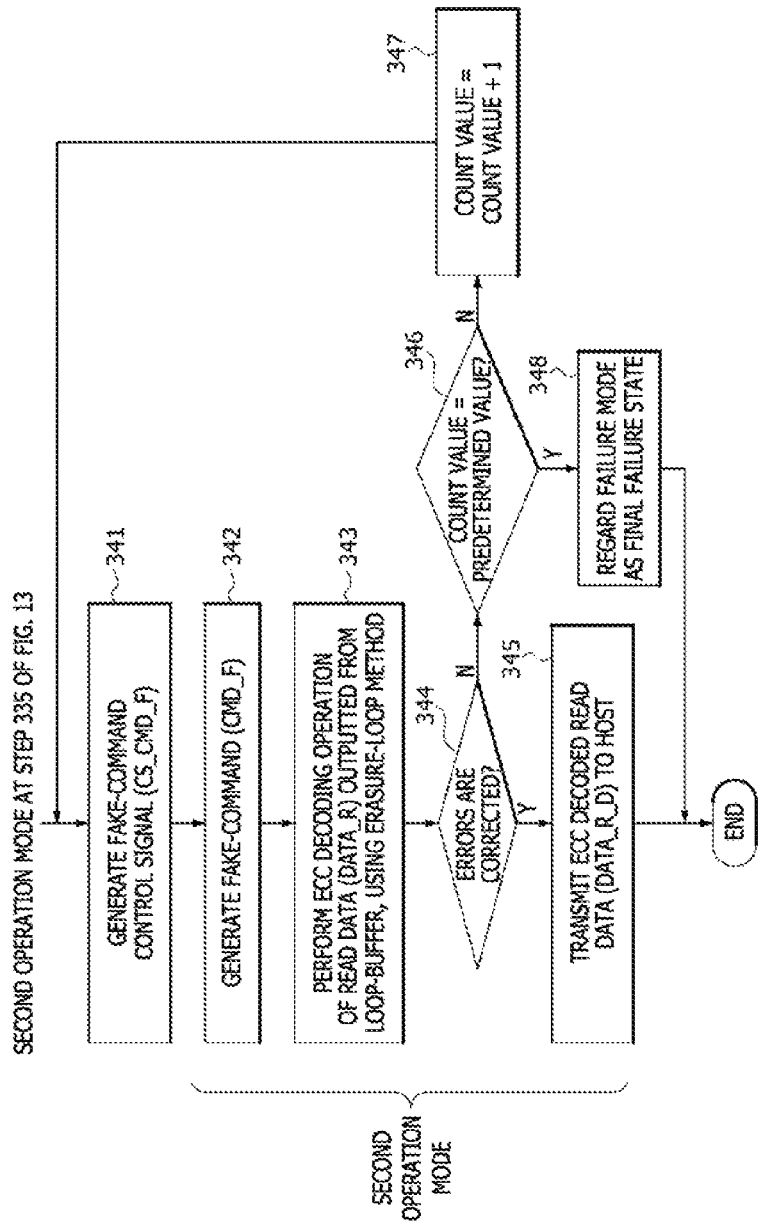
FIG. 15 is a flowchart illustrating an operation performed in a second operation mode of a memory system according to an embodiment of the present disclosure.
Figure 16:
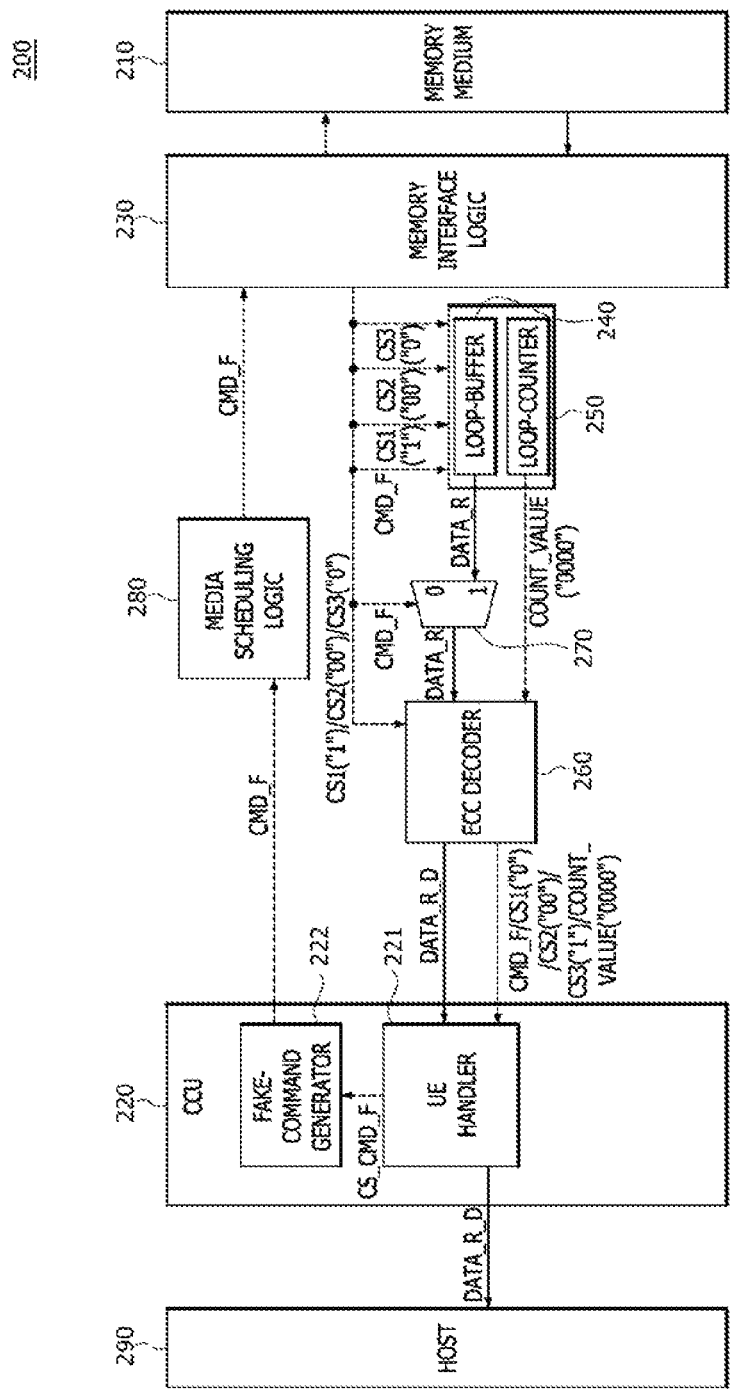
FIGS. 16, 17 and 18 are block diagrams illustrating an operation performed in a second operation mode of a memory system according to an embodiment of the present disclosure.
Figure 17:
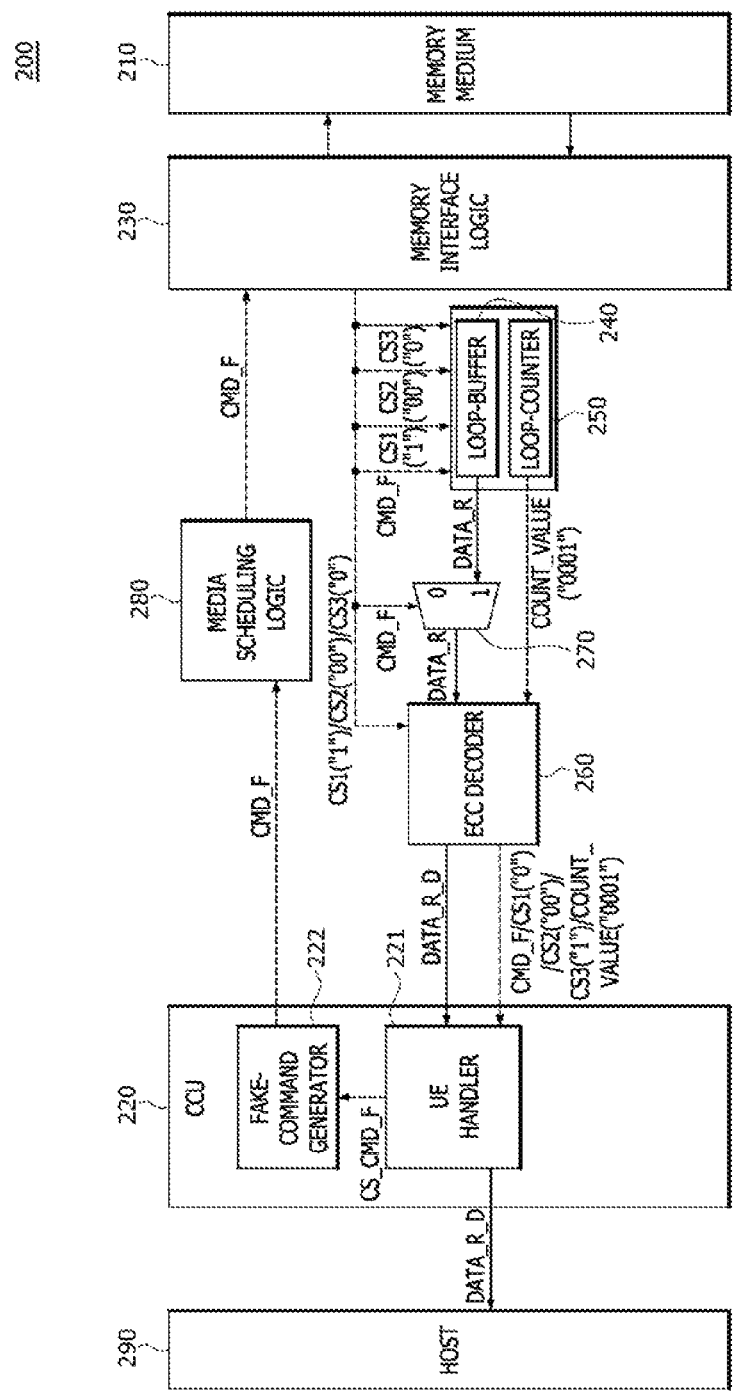
Figure 18:
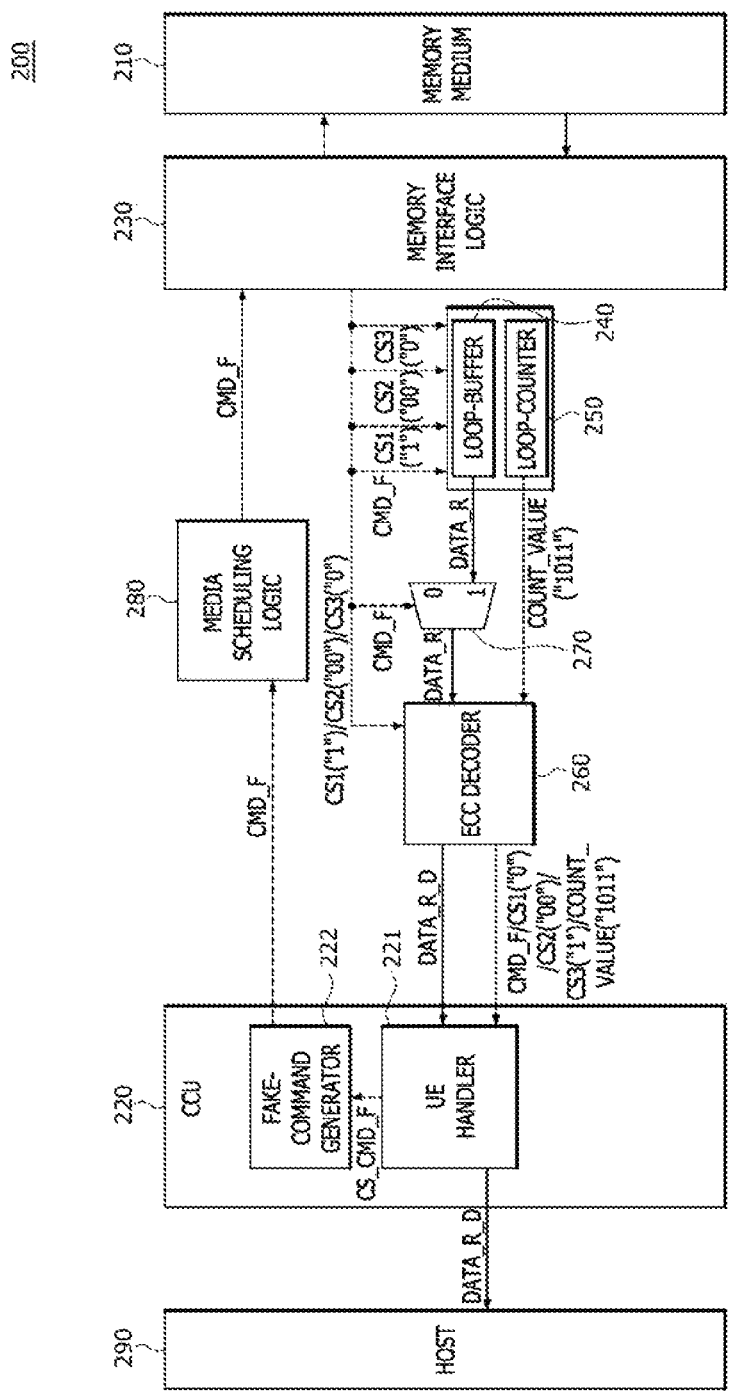
Figure 19:
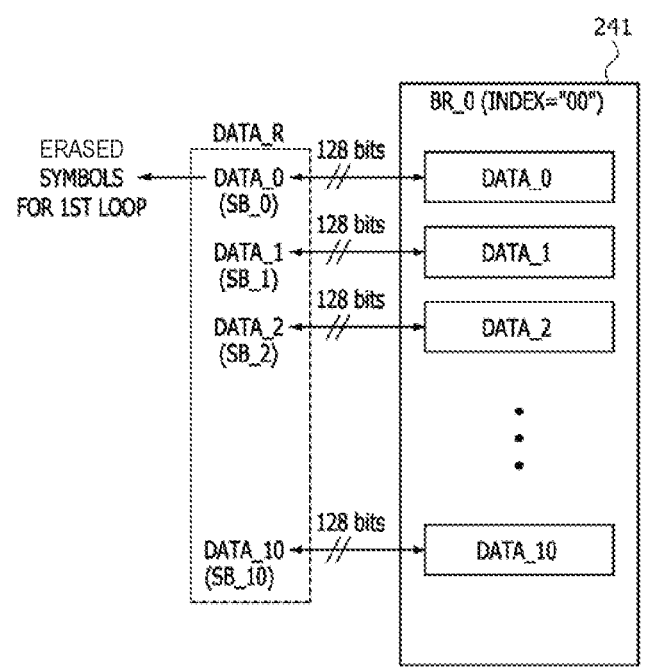
FIGS. 19, 20 and 21 are schematic views illustrating an error correction code (ECC) decoding operation performed with an erasure-loop method in a second operation mode of a memory system according to an embodiment of the present disclosure.
Figure 20:
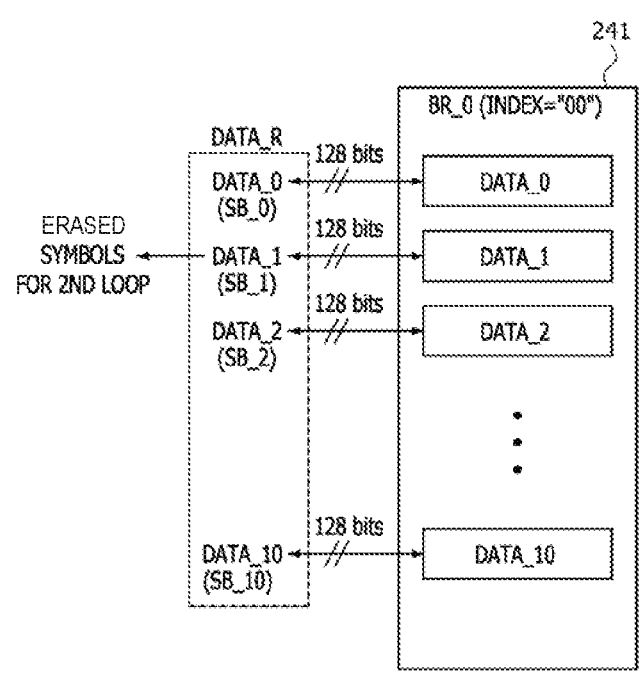
Figure 21:
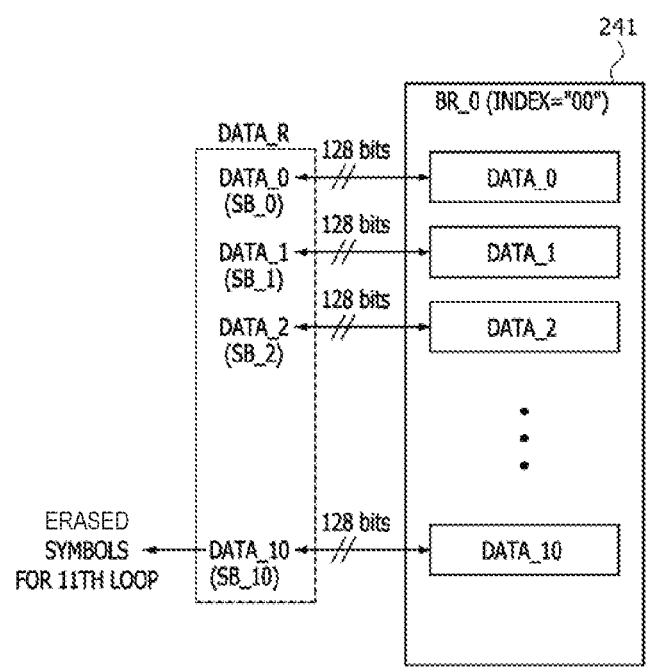

FIG. 15 is a flowchart illustrating operations performed in the second operation mode of the memory system 200. FIGS. 16, 17 and 18 are block diagrams illustrating operations performed in the second operation mode of the memory system 200, and FIGS. 19, 20 and 21 are schematic views illustrating the ECC decoding operation performed with the erasure-loop method in the second operation mode of the memory system 200. In FIGS. 16 to 18, the same reference numerals or characters as used in FIG. 5 denote the same elements. In the present embodiment, the second operation mode may be defined as a process that the ECC decoding operation is performed using the erasure-loop method when the errors of the read data DATA_R are not corrected by the retry operation. Referring to FIGS. 15 and 16, the UE handler 221 may generate and output the fake-command control signal CS_CMD_F to the fake-command generator 222 at a step 341. At a step 342, the fake-command generator 222 may generate and output the fake-command CMD_F in response to the fake-command control signal CS_CMD_F. The fake-command CMD_F may be inputted to the memory interface logic circuit 230 through the media scheduling logic circuit 280.

At a step 343, the ECC decoder 260 may perform the ECC decoding operation of the read data DATA_R outputted from the loop-buffer 240, using the erasure-loop method. In such a case, symbols to be erased may be selected by the count value COUNT_VALUE outputted from the loop-counter 250. More specifically, the memory interface logic circuit 230 may receive the fake-command CMD_F to interrupt that the memory interface logic circuit 230 accesses to the memory medium 210. Thus, the read data DATA_R in the memory medium 210 might not be inputted to the first input terminal "0" of the multiplexer 270. The interruption of the access to the memory medium 210 may be maintained until the second operation mode terminates.

The memory interface logic circuit 230 may receive the fake-command CMD_F to generate the first control signal CS1 having a logic "high(1)" level, the second control signal CS2 having a logic level combination of "00", and the third control signal CS3 having a logic "low(0)" level. The memory interface logic circuit 230 may transmit the fake-command CMD_F to each of the loop-buffer 240, the loop-counter 250, the ECC decoder 260 and the control terminal of the multiplexer 270. In addition, the memory interface logic circuit 230 may output the first control signal CS1 having a logic "high(1)" level, the second control signal CS2 having a logic level combination of "00", and the third control signal CS3 having a logic "low(0)" level to each of the loop-buffer 240, the loop-counter 250 and the ECC decoder 260.

The loop-buffer 240 may output the read data DATA_R stored in the first buffer region 241 designated by the second control signal CS2 having a logic level combination of "00" in response to the fake-command CMD_F and the first control signal CS1 having a logic "high(1)" level, as described with reference to FIG. 7. The loop-counter 250 may output the count value (i.e., "0000") of the first counter 251 designated by the second control signal CS2 having a logic level combination of "00", as described with reference to FIG. 8.

Because the first control signal CS1 has a logic "high(1)" level, the ECC decoder 260 may perform the ECC decoding operation using the erasure-loop method for the read data DATA_R at the step 343. In the present embodiment, the storage operation of the loop-buffer 240 and the reset operation of the loo-counter 250 might not be performed because the third control signal CS3 has a logic "low(0)" level. According to detailed descriptions of the step 343, the ECC decoder 260 may perform the ECC decoding operation using the erasure-loop method for the read data DATA_R stored in the loop-buffer 240. The ECC decoding operation using the erasure-loop method may be iteratively performed by several loops, for example, by eleven loops. In an embodiment, the number of the loops may be equal to the number of memory chips constituting the memory medium 210.

As illustrated in FIG. 19, the read data DATA_R stored in the first buffer region 241 of the loop-buffer 240 may be configured to include the first to eleventh data DATA_0~DATA_10. The first to eleventh data DATA_0~DATA_10 may be data which are outputted from respective ones of the first to eleventh memory chips constituting the memory medium 210. The first data DATA_0 may constitute a first symbol SB_0. The second data DATA_1 may constitute a second symbol SB_1. The third data DATA_2 may constitute a third symbol SB_2. In this way, the eleventh data DATA_10 may constitute an eleventh symbol SB_10. Each of the first to eleventh symbols SB_0~SB_10 may include a plurality of unit symbols. For example, if each of the unit symbols is comprised of 8-bit data, each of the first to eleventh symbols SB_0~SB_10 may include 16 unit symbols. During the ECC decoding operation using the erasure-loop method, the first loop may be executed after the first symbol SB_0 comprised of the first data DATA_0, which are outputted from the first memory chip and stored in the loop-buffer 240, is erased.

Referring again to FIG. 16, the ECC decoder 260 may execute the first loop of the ECC decoding operation using the erasure-loop method to output the ECC decoded read data DATA_R_D. The ECC decoded read data DATA_R_D may be inputted to the UE handler 221 of the command control unit (CCU) 220. The ECC decoder 260 may also transmit the fake-command CMD_F, the first to third control signals CS1~CS3, and the count value COUNT_VALUE in addition to the ECC decoded read data DATA_R_D to the UE handler 221 such that the UE handler 221 recognizes an ECC decoding condition.

At a step 344, the UE handler 221 may receive the ECC decoded read data DATA_R_D to discriminate whether the errors of the read data DATA_R are corrected. If the ECC decoded read data DATA_R_D are regarded as corrected data of the read data DATA_R at the step 344, the UE handler 221 may transmit the ECC decoded read data DATA_R_D to the host 290 and may terminate the read operation for outputting the read data DATA_R from the memory medium 210 (see a step 345). In contrast, if the ECC decoded read data DATA_R_D are regarded as erroneous data of the read data DATA_R at the step 344, whether the count value COUNT_VALUE is equal to a predetermined value may be discriminated at a step 346.

If the count value COUNT_VALUE is not equal to the predetermined value at the step 346 (i.e., all of the loops of the ECC decoding operation using the erasure-loop method are not executed), the loop-counter 250 may increase the count value COUNT_VALUE by one at a step 347. In the present embodiment, the count value COUNT_VALUE may be a binary stream having four bits. In such a case, as described with reference to FIG. 8, the count value COUNT_VALUE of the first counter 251 having an index of "00", which is designated by the second control signal CS2 having a logic level combination of "00", may increase from a binary number of "0000" into a binary number of "0001". If the count value COUNT_VALUE increases at the step 347, the process may be fed back to the step 341 such that the steps 341~343 are sequentially executed again. The steps 341 and 342 executed again may be the same as the steps 341 and 342 executed in the first loop. The step 343 executed again may be different from the step 343 executed previously in terms of only the sequence of the loop.

As illustrated in FIG. 17, the count value COUNT_VALUE of "0001" may be transmitted from the loop-counter 250 to the ECC decoder 260. Thus, the ECC decoder 260 may perform the ECC decoding operation of the second loop using the erasure-loop method. As illustrated in FIG. 20, the second loop may be executed after the second symbol SB_1 comprised of the second data DATA_1, which are outputted from the second memory chip and stored in the loop-buffer 240, is erased.

Subsequently, the ECC decoding operation using the erasure-loop method described above may be sequentially and iteratively performed from the third loop to the eleventh loop until the errors of the read data DATA_R are regarded as being corrected at the step 344. In the tenth loop, the count value COUNT_VALUE of the loop-counter 250 may increase to have a binary number of "1010". As illustrated in FIG. 18, in the eleventh loop, the count value COUNT_VALUE of "1011" may be transmitted from the loop-counter 250 to the ECC decoder 260. Thus, the ECC decoder 260 may perform the ECC decoding operation of eleventh loop. As illustrated in FIG. 21, the eleventh loop may be executed after the eleventh symbol SB_10 comprised of the eleventh data DATA_10, which are outputted from the eleventh memory chip and stored in the loop-buffer 240, is erased. If the count value COUNT_VALUE of the loop-counter 250 is consistent with the predetermined value, for example, "1011", the UE handler 221 of the command control unit (CCU) 220 may regard an error correction procedure (i.e., fail mode) as a final failure state and may terminate the read operation of the read data DATA_R.

Figure 22:
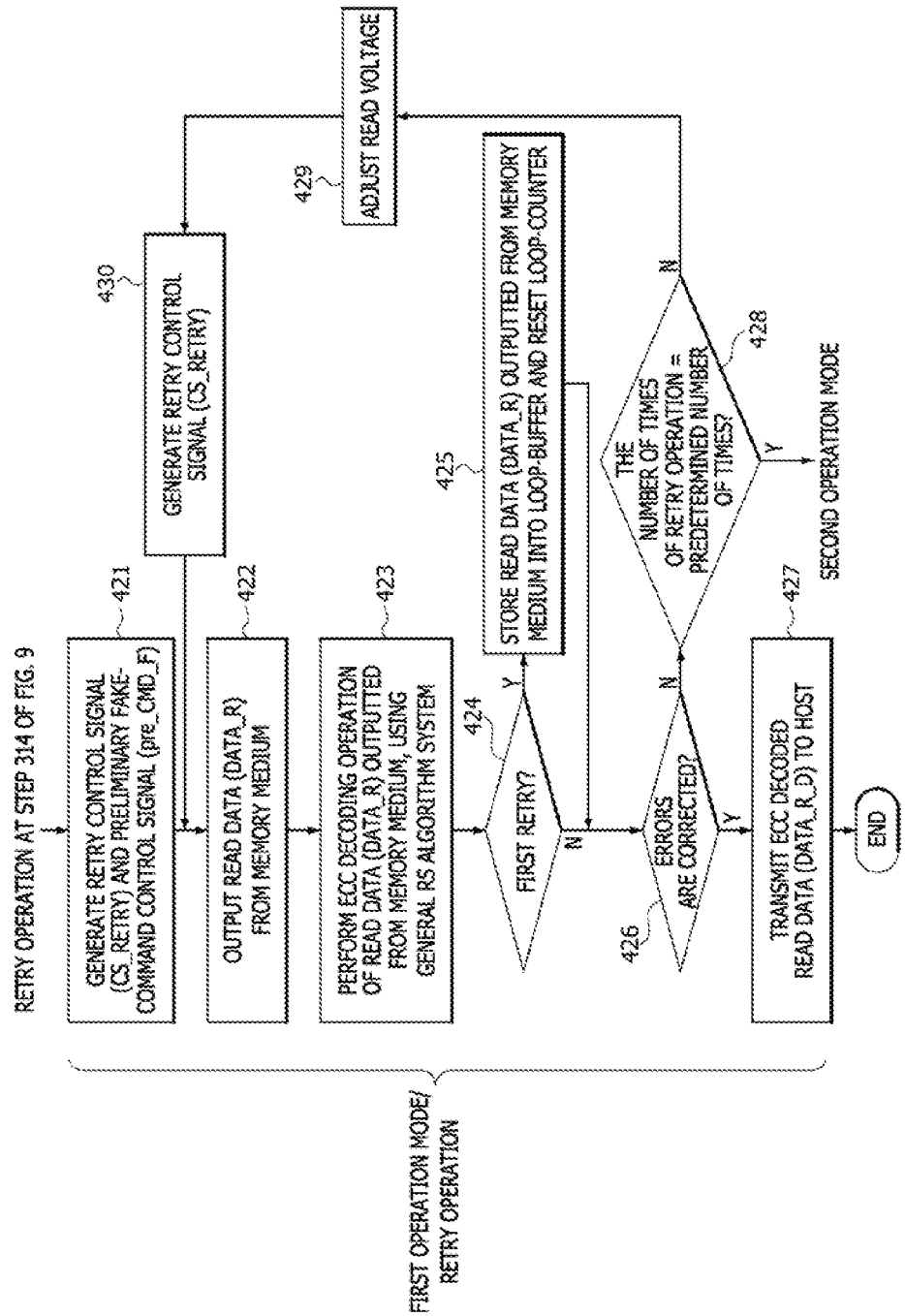
FIG. 22 is a flowchart illustrating an example of operations in a first operation mode/retry operation mode of a memory system according to an embodiment of the present disclosure.
Figure 23:
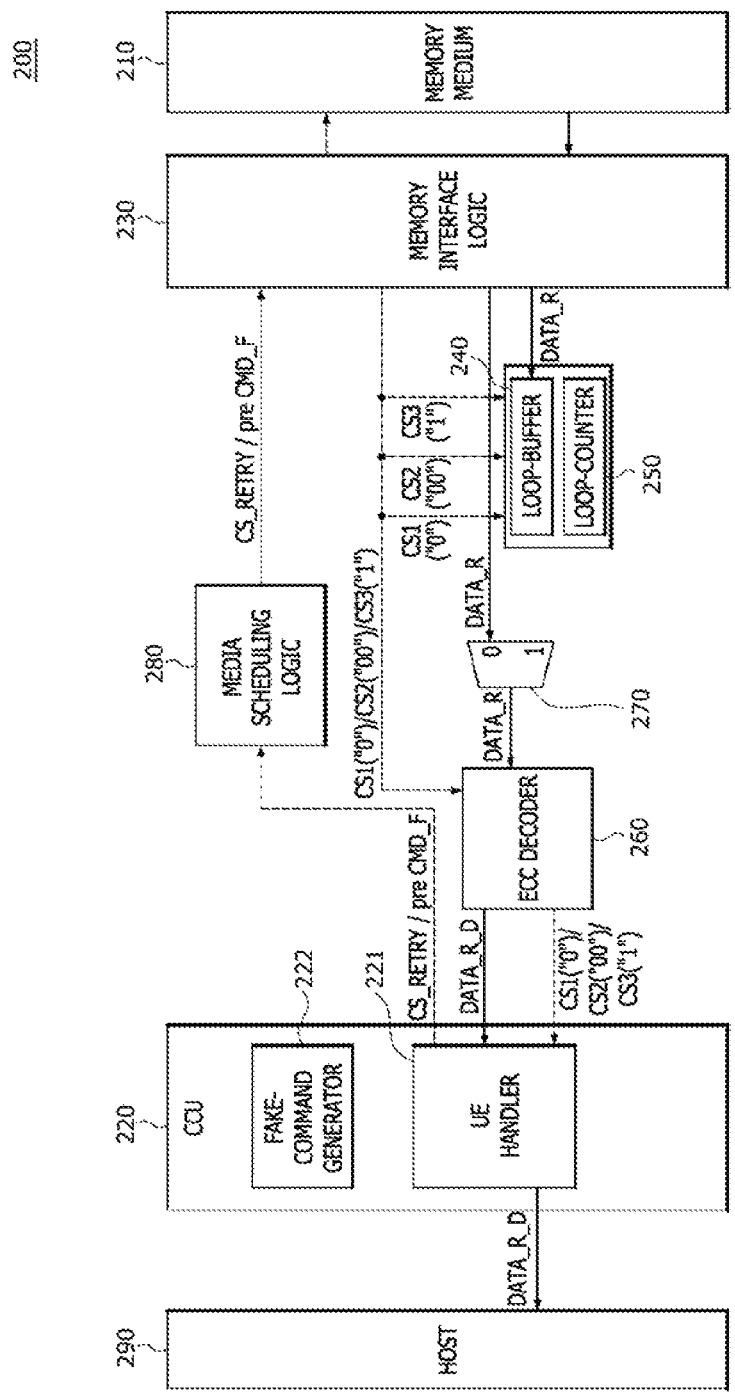
FIGS. 23 and 24 are block diagrams illustrating an example of operations in a first operation mode/retry operation mode of a memory system according to an embodiment of the present disclosure.
Figure 24:
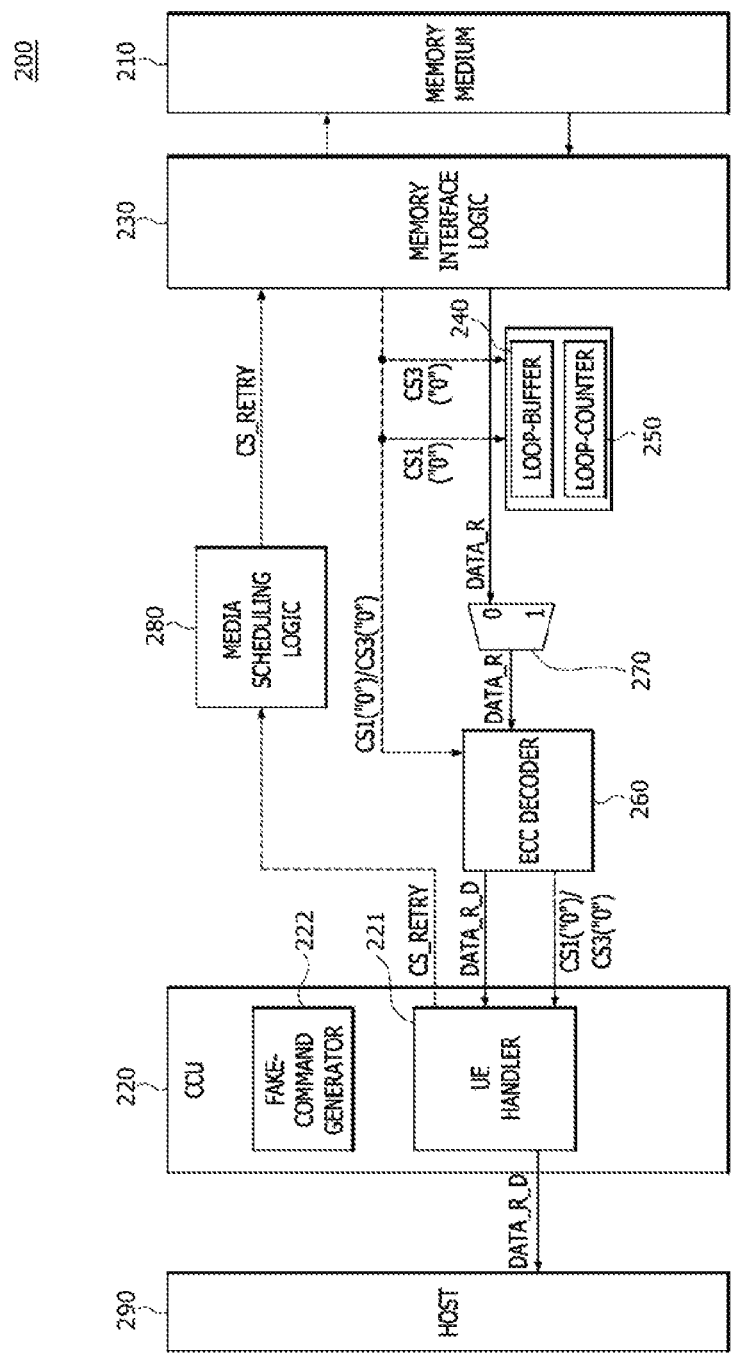

FIG. 22 is a flowchart illustrating an example of operations performed in the first operation mode/retry operation mode of the memory system 200. FIGS. 23 and 24 are block diagrams illustrating an example of operations performed in the first operation mode/retry operation mode of the memory system 200. In FIGS. 23 and 24, the same reference numerals or characters as used in FIG. 5 denote the same elements. According to the present embodiment, when the errors of the read data DATA_R are not corrected after the normal read operation, a first retry operation may be performed together with a process in the first operation mode.

First, the normal read operation illustrated from the step 311 to the step 314 of FIG. 9 may be performed, as described with reference to FIGS. 9 and 10. Next, referring to FIGS. 22 and 23, when the errors are not corrected at the step 314 of FIG. 9, the UE handler 221 may output the retry control signal CS_RETRY and the preliminary fake-command control signal pre_CMD_F at a step 421. The retry control signal CS_RETRY and the preliminary fake-command control signal pre_CMD_F may be transmitted to the memory interface logic circuit 230 through the media scheduling logic circuit 280. At a step 422, the memory interface logic circuit 230 may access to the memory medium 210 in response to the retry control signal CS_RETRY and the preliminary fake-command control signal pre_CMD_F. This process may be the same as the process that the memory interface logic circuit 230 accesses to the memory medium 210 in response to the read command CMD_R.

The memory interface logic circuit 230 may transmit the read data DATA_R from the memory medium 210 to the ECC decoder 260 through the multiplexer 270. Specifically, the memory interface logic circuit 230 may output the read data DATA_R to the first input terminal "0" of the multiplexer 270 and may also output the first control signal CS1 having a logic "low(0)" level, the second control signal CS2 having a logic level combination of "00", and the third control signal CS3 having a logic "high(1)" level to each of the loop-buffer 240, the loop-counter 250 and the ECC decoder 260. Because the fake-command CMD_F is not inputted to the control terminal of the multiplexer 270, the multiplexer 270 may transmit the read data DATA_R inputted to the first input terminal "0" to the ECC decoder 260. Because the first control signal CS1 has a logic "low(0)" level, the ECC decoder 260 may perform the ECC decoding operation of the read data DATA_R using the general RS algorithm system at a step 423 as described about the normal read operation.

At a step 424, whether the current retry operation is a first retry operation may be discriminated. If the current retry operation corresponds to the first retry operation at the step 424, the read data DATA_R outputted from the memory medium 210 may be stored into the loop-buffer 240 and the loop-counter 250 may be reset at a step 425. Although the steps 424 and 425 are illustrated with two separate blocks in FIG. 22, the steps 423, 424 and 425 may be simultaneously performed in some embodiments. That is, the ECC decoding operation performed by the ECC decoder 260 to decode the read data DATA_R outputted from the memory medium 210 may be concurrently executed with a storage operation for storing the read data DATA_R outputted from the memory medium 210 into the loop-buffer 240 and a reset operation for resetting the loop-counter 250.

The step 423 will be described in more detail hereinafter. The ECC decoder 260 may perform the ECC decoding operation of the read data DATA_R outputted from the memory medium 210. As described about the normal read operation, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first, second and third control signals CS1, CS2 and CS3 in addition to the ECC decoded read data DATA_R_D to the UE handler 221.

The step 425 will be described in more detail hereinafter. The loop-buffer 240 may receive the second control signal CS2 having a logic level combination of "00" and the third control signal CS3 having a logic "high(1)" level to store the read data DATA_R outputted from the memory medium 210. As described with reference to FIG. 7, the read data DATA_R may be stored into the first buffer region 241 having an index of "00" designated by the second control signal CS2 through a control operation of the loop-counter controller 255 included in the loop-counter 250. In addition, as described with reference to FIG. 8, the loop-counter 250 may receive the second control signal CS2 having a logic level combination of "00" and the third control signal CS3 having a logic "high(1)" level to reset the first counter 251 having an index of "00" designated by the second control signal CS2 through a control operation of the loop-counter controller 255.

At a step 426, the UE handler 221 may receive the ECC decoded read data DATA_R_D to discriminate whether the errors of the read data DATA_R are corrected. If the ECC decoded read data DATA_R_D are regarded as corrected data of the read data DATA_R at the step 426, the UE handler 221 may transmit the ECC decoded read data DATA_R_D to the host 290 and may terminate the read operation for outputting the read data DATA_R from the memory medium 210 (see a step 427). In contrast, if the ECC decoded read data DATA_R_D are regarded as erroneous data of the read data DATA_R at the step 426, whether the number of times that the retry operation is performed is equal to a predetermined number of times may be discriminated at a step 428. If the number of times that the retry operation is performed is less than the predetermined number of times (i.e., the current retry operation is the first retry operation), the read voltage may be adjusted at a step 429. In an embodiment, adjustment of the read voltage may be executed by increasing the read voltage in order to increase the error correction possibility. After the read voltage is adjusted at the step 429, the retry control signal CS_RETRY may be generated at a step 430, and the process may then be fed back to the step 422 to output the read data DATA_R from the memory medium 210.

Subsequently, the steps 422 to 430 may be sequentially and iteratively executed until the errors of the read data DATA_R outputted from the memory medium 210 are corrected or the number of times that the retry operation is iteratively performed is equal to the predetermined number of times. In such a case, the step 425 may be omitted after the first retry operation. Specifically, as illustrated in FIG. 24, the memory interface logic circuit 230 may access to the memory medium 210 in response to the retry control signal CS_RETRY at the step 422. The memory interface logic circuit 230 may transmit the read data DATA_R from the memory medium 210 to the ECC decoder 260 through the multiplexer 270. Specifically, the memory interface logic circuit 230 may output the read data DATA_R to the first input terminal "0" of the multiplexer 270 and may also output the first control signal CS1 having a logic "low(0)" level and the third control signal CS3 having a logic "low (0)" level to each of the loop-buffer 240, the loop-counter 250 and the ECC decoder 260. Because the fake-command CMD_F is not inputted to the control terminal of the multiplexer 270, the multiplexer 270 may transmit the read data DATA_R inputted to the first input terminal "0" to the ECC decoder 260. Because the first control signal CS1 has a logic "low(0)" level, the ECC decoder 260 may perform the ECC decoding operation of the read data DATA_R using the general RS algorithm system at the step 423 as described about the normal read operation.

Because the current retry operation is a second retry operation at the step 424, the UE handler 221 may discriminate whether the errors of the read data DATA_R are corrected (see the step 426). If the ECC decoded read data DATA_R_D are regarded as corrected data of the read data DATA_R at the step 426, the UE handler 221 may transmit the ECC decoded read data DATA_R_D to the host 290 and may terminate the read operation for outputting the read data DATA_R from the memory medium 210 (see the step 427). In contrast, if the ECC decoded read data DATA_R_D are regarded as erroneous data of the read data DATA_R at the step 426, whether the number of times that the retry operation is performed is equal to the predetermined number of times may be discriminated at the step 428. If the number of times that the retry operation is performed is equal to the predetermined number of times, the second operation mode may be activated. The process of the second operation mode may be the same as described with reference to FIGS. 15 to 21. In contrast, if the number of times that the retry operation is iteratively performed is less than the predetermined number of times, the read voltage may be adjusted at the step 429 and the retry control signal CS_RETRY may be generated at the step 430.

As the retry operation is iteratively performed, the read voltage may be more and more boosted. This may cause additional error occurrence of the read data DATA_R stored in the memory medium 210. However, according to the present embodiment, the read data DATA_R outputted from the memory medium 210 are stored into the loop-buffer 240 at the step 425 during the first retry operation is performed. Thus, even though the additional errors of the read data DATA_R are generated due to the boosted read voltage after the retry operation is iteratively performed by the predetermined number of times, the ECC decoding operation in the second operation mode may be performed using the read data DATA_R stored in the loop-buffer 240 during the first retry operation.

Figure 25:
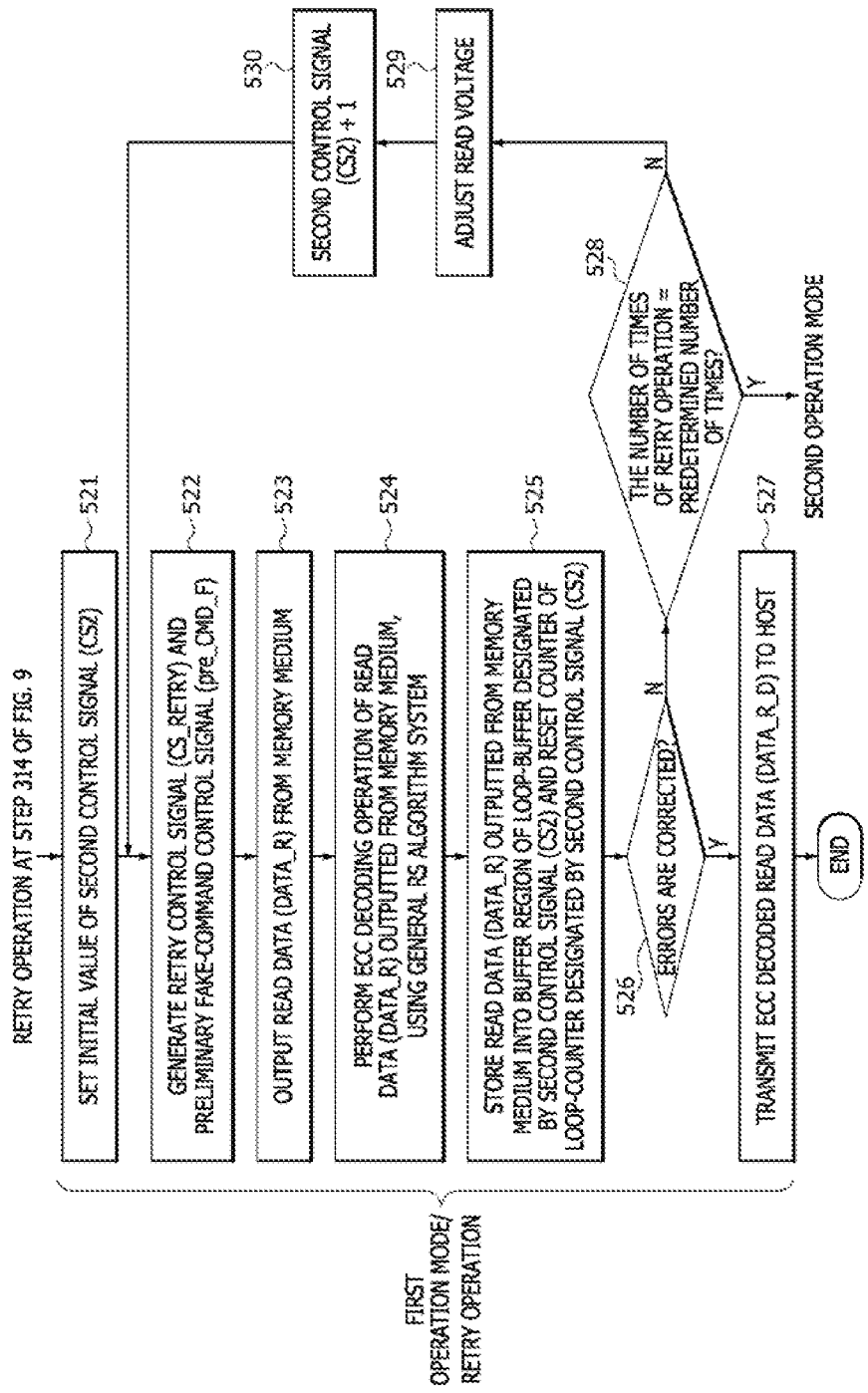
FIG. 25 is a flowchart illustrating another example of operations in a first operation mode/retry operation mode of a memory system according to an embodiment of the present disclosure.
Figure 26:
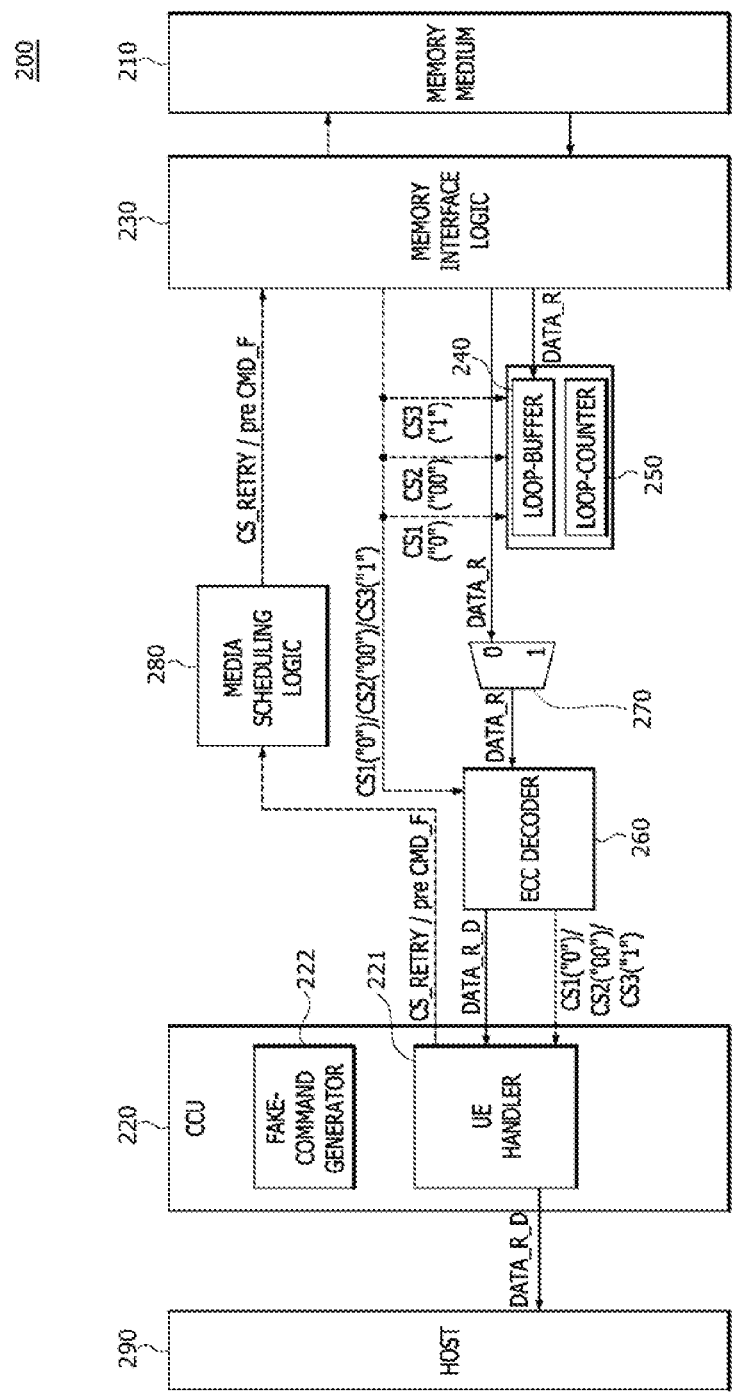
FIG. 26 is a block diagram illustrating another example of operations in a first operation mode and retry operation mode of a memory system according to an embodiment of the present disclosure.
Figure 27:
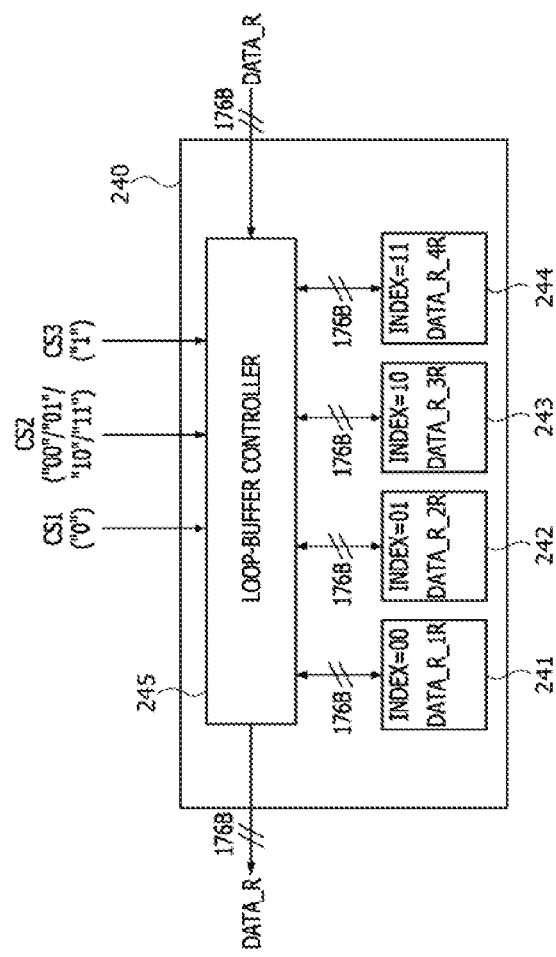
FIG. 27 is a schematic view illustrating a procedure for storing read data into a loop-buffer in a first operation mode and retry operation mode of a memory system according to an embodiment of the present disclosure.

FIG. 25 is a flowchart illustrating another example of a process executed in the first operation mode/retry operation mode of the memory system 200. FIG. 26 is a block diagram illustrating another example of a process executed in the first operation mode/retry operation mode of the memory system 200, and FIG. 27 is a schematic view illustrating a procedure for storing the read data DATA_R into the loop-buffer 240 in the first operation mode/retry operation mode of the memory system 200. In FIG. 26, the same reference numerals or characters as used in FIG. 5 denote the same elements. In FIG. 27, the same reference numerals or characters as used in FIG. 7 denote the same elements. A state of the errors of the read data DATA_R may vary to be different due to the read voltage that is boosted whenever the retry operation is repeatedly performed. In the present embodiment, whenever the retry operation is repeatedly performed, the first operation mode may also be activated to perform the retry operation in the first operation mode. Thus, a plurality of sets of read data DATA_R having different error states may be stored into the loop-buffer 240. Accordingly, the error correction probability may be more improved by performing the ECC decoding operation for the plurality sets of read data DATA_R having different error states, which are stored in the loop-buffer 240, in the second operation mode.

First, the normal read operation illustrated from the step 311 to the step 314 of FIG. 9 may be performed, as described with reference to FIGS. 9 and 10. Next, referring to FIGS. 25 and 26, when the errors are not corrected at the step 314 of FIG. 9, an initial value of the second control signal CS2 may be set at a step 521. In an embodiment, if the second control signal CS2 is a 2-bit binary stream, the initial value of the second control signal CS2 may be set to have a binary number of "00". At a step 522, the UE handler 221 may output the retry control signal CS_RETRY and the preliminary fake-command control signal pre_CMD_F. The retry control signal CS_RETRY and the preliminary fake-command control signal pre_CMD_F may be transmitted to the memory interface logic circuit 230 through the media scheduling logic circuit 280. At a step 523, the memory interface logic circuit 230 may access to the memory medium 210 in response to the retry control signal CS_RETRY and the preliminary fake-command control signal pre_CMD_F. This process may be the same as the process that the memory interface logic circuit 230 accesses to the memory medium 210 in response to the read command CMD_R.

The memory interface logic circuit 230 may transmit the read data DATA_R from the memory medium 210 to the ECC decoder 260 through the multiplexer 270. Specifically, the memory interface logic circuit 230 may output the read data DATA_R to the first input terminal "0" of the multiplexer 270 and may also output the first control signal CS1 having a logic "low(0)" level, the second control signal CS2 having a logic level combination of "00", and the third control signal CS3 having a logic "high(1)" level to each of the loop-buffer 240, the loop-counter 250 and the ECC decoder 260. Because the fake-command CMD_F is not inputted to the control terminal of the multiplexer 270, the multiplexer 270 may transmit the read data DATA_R inputted to the first input terminal "0" to the ECC decoder 260. Because the first control signal CS1 has a logic "low(0)" level, the ECC decoder 260 may perform the ECC decoding operation of the read data DATA_R using the general RS algorithm system at a step 524 as described about the normal read operation.

At a step 525, the read data DATA_R outputted from the memory medium 210 may be stored into the loop-buffer 240, and the loop-counter 250 may be reset. Although the steps 524 and 525 are illustrated with two separate blocks in FIG. 25, the steps 524 and 525 may be simultaneously performed. The step 524 will be described in more detail hereinafter. The ECC decoder 260 may perform the ECC decoding operation of the read data DATA_R outputted from the memory medium 210. As described about the normal read operation, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first, second and third control signals CS1, CS2 and CS3 in addition to the ECC decoded read data DATA_R_D to the UE handler 221.

The step 525 will be described in more detail hereinafter. The loop-buffer 240 may receive the second control signal CS2 having a logic level combination of "00" and the third control signal CS3 having a logic "high(1)" level to store the read data DATA_R outputted from the memory medium 210. As illustrated in FIG. 27, read data DATA_R_1R outputted by the first retry operation may be stored into the first buffer region 241 having an index of "00" designated by the second control signal CS2 through a control operation of the loop-counter controller 255 included in the loop-counter 250. In addition, as described with reference to FIG. 8, the loop-counter 250 may receive the second control signal CS2 having a logic level combination of "00" and the third control signal CS3 having a logic "high(1)" level to reset the first counter 251 having an index of "00" designated by the second control signal CS2 through a control operation of the loop-counter controller 255.

At a step 526, the UE handler 221 may receive the ECC decoded read data DATA_R_D to discriminate whether the errors of the read data DATA_R are corrected. If the ECC decoded read data DATA_R_D are regarded as corrected data of the read data DATA_R at the step 526, the UE handler 221 may transmit the ECC decoded read data DATA_R_D to the host 290 and may terminate the read operation for outputting the read data DATA_R from the memory medium 210 (see a step 527). In contrast, if the ECC decoded read data DATA_R_D are regarded as erroneous data of the read data DATA_R at the step 526, whether the number of times that the retry operation is performed is equal to a predetermined number of times may be discriminated at a step 528. If the number of times that the retry operation is iteratively performed is equal to the predetermined number of times at the step 528, the second operation mode may be activated. The process of the second operation mode may be the same as described with reference to FIGS. 15 to 21. In contrast, if the number of times that the retry operation is performed is less than the predetermined number of times at the step 528, the read voltage may be adjusted at a step 529 and the second control signal CS2 may increase by a binary number of "1" at a step 530. Thus, the second control signal CS2 may be changed from "00" into "01". After the second control signal CS2 increases, the process may be fed back to the step 522 to generate the retry control signal CS_RETRY and the preliminary fake-command control signal pre_CMD_F.

Subsequently, the steps 523 to 526 may be sequentially and iteratively executed. If the read data DATA_R are regarded as erroneous data at the step 526, read data DATA_R_2R outputted by the second retry operation and a second process of the first operation mode may be stored into the second buffer region 242 having an index of "01" designated by the second control signal CS2 through a control operation of the loop-counter controller 255 included in the loop-counter 250, as illustrated in FIG. 27. In addition, as described with reference to FIG. 8, the loop-counter 250 may receive the second control signal CS2 having a logic level combination of "01" and the third control signal CS3 having a logic "high(1)" level to reset the second counter 252 having an index of "01" designated by the second control signal CS2 through a control operation of the loop-counter controller 255.

If the number of times that the retry operation is performed is less than the predetermined number of times at the step 528, a third loop including a third retry operation and a third process of the first operation mode may be executed. In such a case, the second control signal CS2 may be changed from a binary number of "01" into a binary number of "10". Read data DATA_R_3R outputted by the third retry operation and the third process of the first operation mode may be stored into the third buffer region 243 having an index of "10" designated by the second control signal CS2 through a control operation of the loop-counter controller 255 included in the loop-counter 250, as illustrated in FIG. 27. In addition, as described with reference to FIG. 8, the loop-counter 250 may receive the second control signal CS2 having a logic level combination (i.e., a binary number) of "10" and the third control signal CS3 having a logic "high (1)" level to reset the third counter 253 having an index of "10" designated by the second control signal CS2 through a control operation of the loop-counter controller 255.

If the number of times that the retry operation is performed is less than the predetermined number of times at the step 528, a fourth loop including a fourth retry operation and a fourth process of the first operation mode may be executed. In such a case, the second control signal CS2 may be changed from a binary number of "10" into a binary number of "11". Read data DATA_R_4R outputted by the fourth retry operation and the fourth process of the first operation mode may be stored into the fourth buffer region 244 having an index of "11" designated by the second control signal CS2 through a control operation of the loop-counter controller 255 included in the loop-counter 250, as illustrated in FIG. 27. In addition, as described with reference to FIG. 8, the loop-counter 250 may receive the second control signal CS2 having a logic level combination (i.e., a binary number) of "11" and the third control signal CS3 having a logic "high(1)" level to reset the fourth counter 254 having an index of "11" designated by the second control signal CS2 through a control operation of the loop-counter controller 255.

Figure 28:
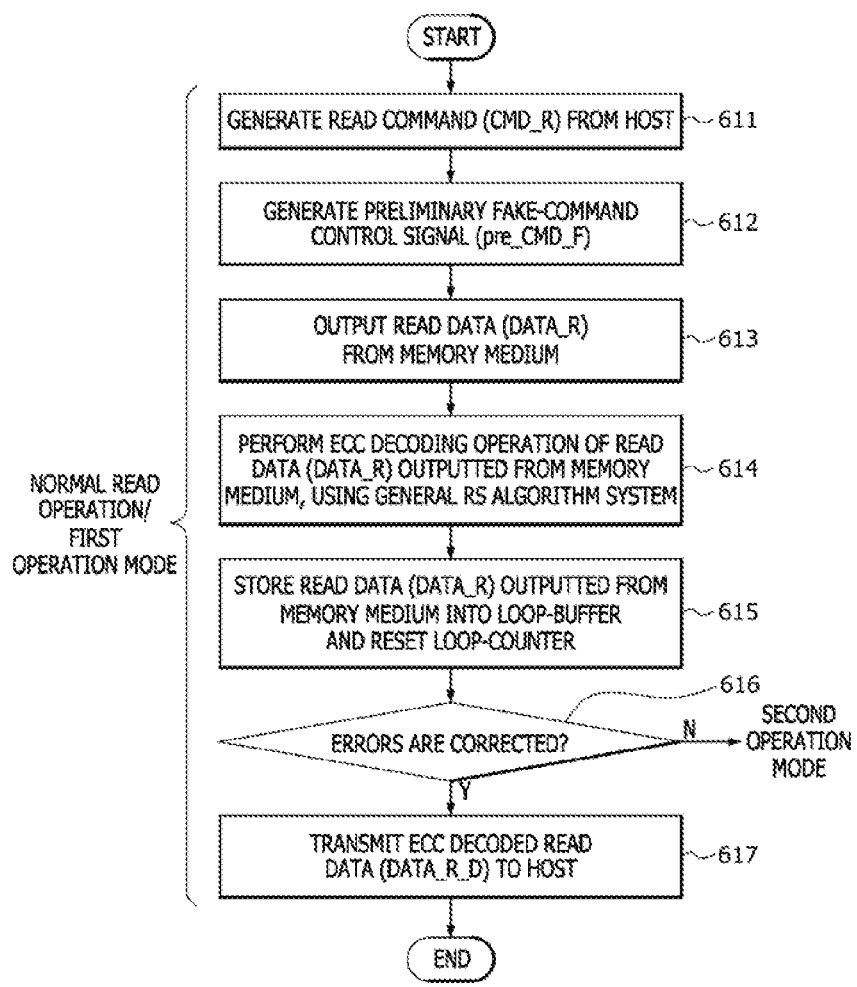
FIG. 28 is a flowchart illustrating operations in a normal read operation mode and first operation mode of a memory system according to an embodiment of the present disclosure.
Figure 29:
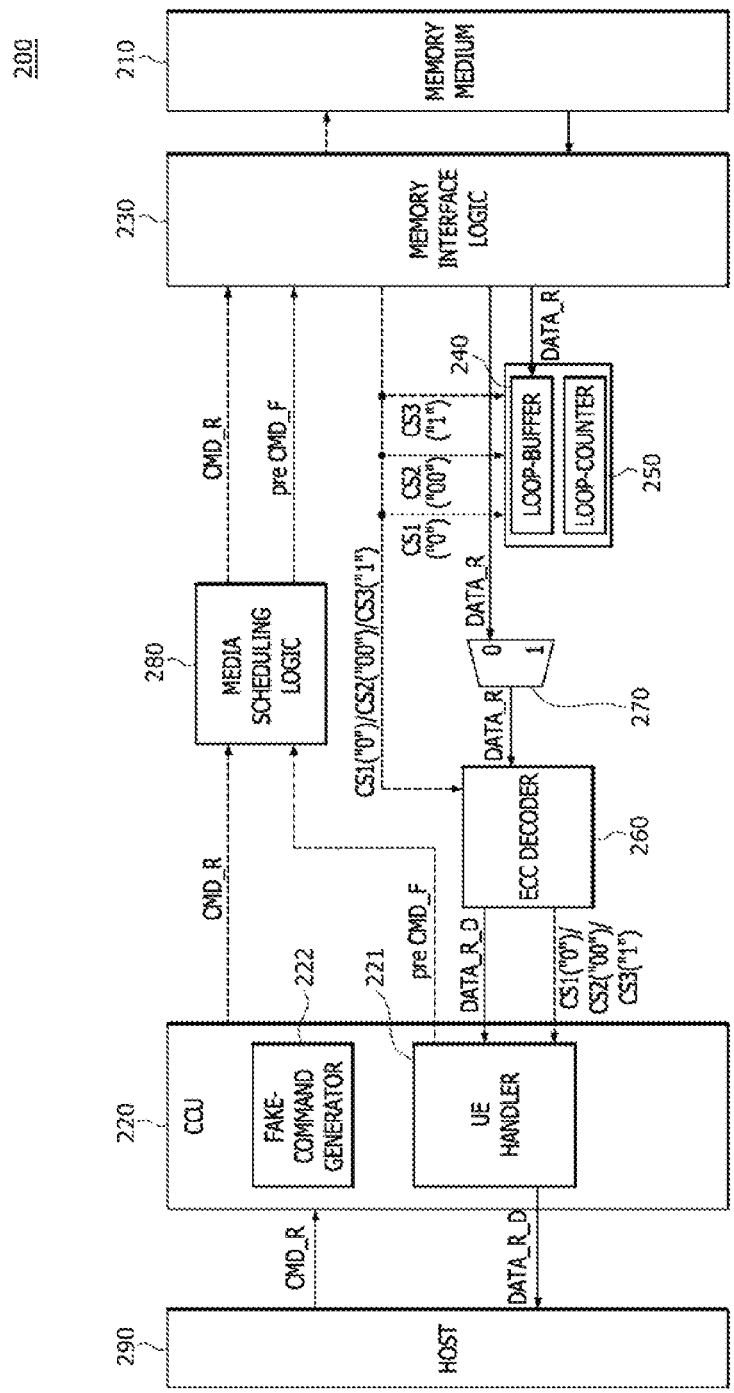
FIG. 29 is a block diagram illustrating operations in a normal read operation mode and first operation mode of a memory system according to an embodiment of the present disclosure.

FIG. 28 is a flowchart illustrating operations in the normal read operation/first operation mode of the memory system 200. FIG. 29 is a block diagram illustrating operations in the normal read operation/first operation mode of the memory system 200. In FIG. 29, the same reference numerals or characters as used in FIG. 5 denote the same elements. In the present embodiment, the retry operation may be omitted, and a process of the first operation mode may be performed during the normal read operation. Thus, if the errors are not corrected even after the normal read operation and process of the first operation mode are executed, the second operation mode may be activated. Referring to FIGS. 28 and 29, if the read command CMD_R is generated from the host at a step 611, the command control unit (CCU) 220 may output the read command CMD_R to the memory interface logic circuit 230 through the media scheduling logic circuit 280. At a step 612, the UE handler 221 of the command control unit (CCU) 220 may output the preliminary fake-command control signal pre_CMD_F. The preliminary fake-command control signal pre_CMD_F may be transmitted to the memory interface logic circuit 230 through the media scheduling logic circuit 280. At a step 613, the memory interface logic circuit 230 may access to the memory medium 210 in response to the read command CMD_R and the preliminary fake-command control signal pre_CMD_F.

The memory interface logic circuit 230 may transmit the read data DATA_R from the memory medium 210 to the ECC decoder 260 through the multiplexer 270. Specifically, the memory interface logic circuit 230 may output the read data DATA_R to the first input terminal "0" of the multiplexer 270 and may also transmit the first control signal CS1 having a logic "low(0)" level, the second control signal CS2 having a logic level combination (i.e., a binary number) of "00", and the third control signal CS3 having a logic "high(1)" level to each of the loop-buffer 240, the loop-counter 250 and the ECC decoder 260. In such a case, because the fake command CMD_F is not inputted to the control terminal of the multiplexer 270, the multiplexer 270 may output the read data DATA_R inputted to the first input terminal "0" to the ECC decoder 260. Because the first control signal CS1 has a logic "low(0)" level, the ECC decoder 260 may perform the ECC decoding operation of the read data DATA_R using the general RS algorithm system at a step 614.

At a step 615, the read data DATA_R outputted from the memory medium 210 may be stored into the loop-buffer 240 and the loop-counter 250 may be reset. Although the steps 614 and 615 are illustrated with two separate blocks in FIG. 28, the steps 614 and 615 may be simultaneously performed. According to detailed descriptions of the step 614, the ECC decoder 260 may perform the ECC decoding operation of the read data DATA_R outputted from the memory medium 210. As described about the normal read operation, the ECC decoding operation may be performed using the general RS algorithm system. The ECC decoder 260 may perform the ECC decoding operation to output the ECC decoded read data DATA_R_D. The ECC decoded read data DATA_R_D may be inputted to the UE handler 221 of the command control unit (CCU) 220. The ECC decoder 260 may also transmit the first, second and third control signals CS1, CS2 and CS3 in addition to the ECC decoded read data DATA_R_D to the UE handler 221.

The step 615 will be described in more detail hereinafter. The loop-buffer 240 may receive the second control signal CS2 having a logic level combination of "00" and the third control signal CS3 having a logic "high(1)" level to store the read data DATA_R outputted from the memory medium 210. The read data DATA_R outputted from the memory medium 210 by the normal read operation may be stored into the first buffer region 241 having an index of "00" designated by the second control signal CS2 through a control operation of the loop-counter controller 255 included in the loop-counter 250. In addition, as described with reference to FIG. 8, the loop-counter 250 may receive the second control signal CS2 having a logic level combination of "00" and the third control signal CS3 having a logic "high(1)" level to reset the first counter 251 having an index of "00" designated by the second control signal CS2 through a control operation of the loop-counter controller 255.

At a step 616, the UE handler 221 may receive the ECC decoded read data DATA_R_D to discriminate whether the errors of the read data DATA_R are corrected. If the ECC decoded read data DATA_R_D are regarded as corrected data of the read data DATA_R at the step 616, the UE handler 221 may transmit the ECC decoded read data DATA_R_D to the host 290 and may terminate the read operation for outputting the read data DATA_R from the memory medium 210 (see a step 617). In contrast, if the ECC decoded read data DATA_R_D are regarded as erroneous data of the read data DATA_R at the step 616, the second operation mode may be activated. A process of the second operation mode may be the same as described with reference to FIGS. 15 to 21.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
a memory medium;
a loop-buffer configured to store read data outputted from the memory medium in a first operation mode;
a fake-command generator configured to generate a fake-command in a second operation mode; and
an error correction code (ECC) decoder configured to perform an ECC decoding operation of the read data stored in the loop-buffer in response to the fake-command.

2. The memory system of claim 1,
wherein the memory medium includes a plurality of memory chips; and
wherein the read data includes a plurality of data stored in respective ones of the plurality of memory chips.

3. The memory system of claim 1, further comprising an uncorrectable-error (UE) handler configured to receive ECC decoded read data from the ECC decoder to determine one of the first operation mode and the second operation mode to perform as an operation mode.

4. The memory system of claim 3, wherein the UE handler determines the first operation mode to perform as an operation mode when errors of the read data outputted from the memory medium have not been corrected by the ECC decoder.

5. The memory system of claim 3, wherein the UE handler determines the second operation mode to perform as an operation mode after the first operation mode when errors of the read data outputted from the memory medium have not been corrected by the ECC decoder.

6. The memory system of claim 1, wherein the ECC decoder receives the read data outputted from the memory medium to perform the ECC decoding operation on the read data using a general Reed-Solomon (RS) algorithm system, in the first operation mode.

7. The memory system of claim 1, wherein the ECC decoder performs the ECC decoding operation on the read data received from the loop-buffer using an erasure-loop method in the second operation mode.

8. The memory system of claim 1, wherein an operation for accessing to the memory medium is at least one of interrupted and prevented when the fake-command is generated.

9. A memory system comprising:
a memory medium;
a command control unit configured to generate a preliminary fake-command control signal and a fake-command in a first operation mode and a second operation mode, respectively;
a loop-buffer configured to store read data outputted from the memory medium in response to the preliminary fake-command control signal in the first operation mode and configured to output read data stored in the loop-buffer in response to the fake-command in the second operation mode;
a loop-counter configured to perform a reset operation in response to the preliminary fake-command control signal in the first operation mode and configured to output a count value of the loop-counter in response to the fake-command in the second operation mode; and
an error correction code (ECC) decoder configured to perform a first ECC decoding operation of the read data outputted from the memory medium in the first operation mode and configured to perform a second ECC decoding operation of the read data outputted from the loop-buffer in the second operation mode.

10. The memory system of claim 9,
wherein the memory medium includes a plurality of memory chips; and
wherein the read data includes a plurality of data stored in respective ones of the plurality of memory chips.

11. The memory system of claim 9, wherein the command control unit includes:
an uncorrectable-error (UE) handler configured to generate the preliminary fake-command control signal in the first operation mode and configured to generate a fake-command control signal in the second operation mode; and
a fake-command generator configured to generate the fake-command in response to the fake-command control signal in the second operation mode.

12. The memory system of claim 11,
wherein the UE handler generates the preliminary fake-command control signal when errors of the read data outputted from the memory medium are not corrected by a previous ECC decoding operation; and
wherein the UE handler generates the fake-command control signal when errors of the read data outputted from the memory medium are not corrected by an ECC decoding operation in the first operation mode.

13. The memory system of claim 9, further comprising a memory interface logic circuit configured to access to the memory medium in response to the preliminary fake-command control signal and configured to interrupt the access to the memory medium in response to the fake-command.

14. The memory system of claim 13,
wherein the memory interface logic circuit is configured to output first to third control signals to each of the loop-buffer, the loop-counter and the ECC decoder in the first operation mode and the second operation mode;
wherein the first control signal indicates one of activation and inactivation of the second operation mode;
wherein the second control signal has a value of an index; and
wherein the third control signal indicates one of activation and inactivation of the first operation mode.

15. The memory system of claim 14,
wherein the loop-buffer includes a plurality of buffer regions which are distinguished from each other by the index of the second control signal;
wherein the loop-buffer stores the read data into a buffer region designated by the index of the second control signal among the plurality of buffer regions in response to the third control signal indicating the first operation mode; and
wherein the loop-buffer outputs the read data stored in the buffer region designated by the index of the second control signal among the plurality of buffer regions in response to the first control signal indicating the second operation mode.

16. The memory system of claim 15,
wherein the loop-counter includes a plurality of counters which are distinguished from each other by the index of the second control signal;
wherein the loop-counter resets a counter designated by the index of the second control signal among the plurality of counters in response to the third control signal indicating the first operation mode; and
wherein the loop-counter performs a counting operation for outputting and increasing a count value of a counter designated by the index of the second control signal among the plurality of counters in response to the first control signal indicating the second operation mode.

17. The memory system of claim 9,
wherein the ECC decoder performs the first ECC decoding operation using a general Reed-Solomon (RS) algorithm system in the first operation mode; and
wherein the ECC decoder performs the second ECC decoding operation using an erasure-loop method erasing symbols designated by a count value outputted from the loop-counter in the second operation mode.

18. The memory system of claim 9, further comprising a multiplexer configured to receiving read data from the memory medium through a first input terminal, configured to receive read data stored in the loop-buffer through a second input terminal, and configured to selectively output the read data inputted through the first input terminal or the read data inputted through the second input terminal to the ECC decoder according to whether the fake-command is inputted to a control terminal of the multiplexer.

* * * * *